US011439034B2

(12) United States Patent
Chapel et al.

(10) Patent No.: US 11,439,034 B2
(45) Date of Patent: Sep. 6, 2022

(54) UNIFORM EQUIPMENT MOUNTING SYSTEM

(71) Applicant: ZONIT STRUCTURED SOLUTIONS, LLC, Boulder, CO (US)

(72) Inventors: Steve Chapel, Iliff, CO (US); William Pachoud, Boulder, CO (US)

(73) Assignee: ZONIT STRUCTURED SOLUTIONS, LLC, Boulder, CO (US)

( * ) Notice: Subject to any disclaimer, the term of this patent is extended or adjusted under 35 U.S.C. 154(b) by 0 days.

(21) Appl. No.: 17/093,424

(22) Filed: Nov. 9, 2020

(65) Prior Publication Data

US 2021/0307190 A1    Sep. 30, 2021

Related U.S. Application Data

(63) Continuation of application No. 16/040,238, filed on Jul. 19, 2018, now Pat. No. 10,834,841, which is a
(Continued)

(51) Int. Cl.
*H05K 7/14* (2006.01)
*H05K 7/18* (2006.01)
(Continued)

(52) U.S. Cl.
CPC .......... *H05K 7/1489* (2013.01); *A47B 88/427* (2017.01); *A47B 88/43* (2017.01);
(Continued)

(58) Field of Classification Search
CPC ...... H05K 7/1489; H05K 7/183; H05K 7/186; A47B 88/43; A47B 88/427;
(Continued)

(56) References Cited

U.S. PATENT DOCUMENTS 1,938,908 A * 12/1933 Hunter ................. A47B 88/493
                                                    312/334.11
3,050,194 A *  8/1962 Sinninger ............. H05K 7/183
                                                         108/106
(Continued)

FOREIGN PATENT DOCUMENTS

WO    2003049572    6/2003
WO    2009120880    1/2009

OTHER PUBLICATIONS

International Search Report and Written Opinion issued in International Application No. PCT/US2009/038851 dated Sep. 8, 2009, 8 pp.

(Continued)

*Primary Examiner* — Bayan Salone
(74) *Attorney, Agent, or Firm* — Davis Graham & Stubbs LLP

(57) ABSTRACT

A universal mounting system is provided for use in connection with substantially any type of electronic equipment so was to reduce or substantially avoid the need for rail kids or other mounting assemblies that are its equipment specific for mounting equipment to racks. In one implementation, a uniform mounting system (101) includes a number of rail and slider assemblies (112). Each of the rail and slider assemblies includes a slider that is slightly mounted on a support rail. Each of the slider is includes mounting flange is and brackets for mounting the slider to a piece of equipment. The mounting flanges 116 that's collectively define a segmented vertical rail. A safety stop mechanism can be used to define very a offset figurations of the equipment with respect to a front end of the rack.

4 Claims, 16 Drawing Sheets

Related U.S. Application Data continuation of application No. 14/327,212, filed on Jul. 9, 2014, now Pat. No. 10,034,406, which is a continuation of application No. 13/108,838, filed on May 16, 2011, now Pat. No. 8,801,122, which is a continuation of application No. 12/892,009, filed on Sep. 28, 2010, now abandoned, which is a continuation-in-part of application No. PCT/US2009/038851, filed on Mar. 30, 2009.

(60) Provisional application No. 61/157,113, filed on Mar. 3, 2009, provisional application No. 61/157,118, filed on Mar. 3, 2009, provisional application No. 61/040,924, filed on Mar. 31, 2008, provisional application No. 61/040,542, filed on Mar. 28, 2008.

(51) Int. Cl.
 *A47B 88/42* (2017.01)
 *A47B 88/43* (2017.01)
 *A47B 88/427* (2017.01)
 *A47B 88/423* (2017.01)

(52) U.S. Cl.
 CPC ........... *A47B 2088/4235* (2017.01); *A47B 2210/0054* (2013.01); *A47B 2210/0059* (2013.01); *H05K 7/183* (2013.01); *H05K 7/186* (2013.01); *Y10T 29/49002* (2015.01); *Y10T 29/4995* (2015.01); *Y10T 29/49826* (2015.01); *Y10T 29/49947* (2015.01); *Y10T 29/49948* (2015.01)

(58) Field of Classification Search
 CPC .... A47B 2210/0059; A47B 2210/0054; A47B 2088/4235; Y10T 29/49947; Y10T 29/49948; Y10T 29/4995; Y10T 29/49826; Y10T 29/49002
 See application file for complete search history.

(56) References Cited

U.S. PATENT DOCUMENTS

| | | | | |
|---|---|---|---|---|
| 3,133,768 A * | 5/1964 | Klakovich | ........... | H05K 7/1489 312/334.8 |
| 4,067,632 A | 1/1978 | Sekerich | | |
| 4,331,369 A * | 5/1982 | Lazar | ........... | H05K 7/1421 384/23 |
| 6,209,979 B1 * | 4/2001 | Fall | ........... | H05K 7/1489 312/319.1 |
| 6,554,142 B2 * | 4/2003 | Gray | ........... | A47B 57/30 211/175 |
| 6,655,534 B2 * | 12/2003 | Williams | ........... | H05K 7/1489 361/829 |
| 6,702,124 B2 * | 3/2004 | Lauchner | ........... | H05K 7/1421 312/334.44 |
| 6,854,605 B2 * | 2/2005 | Wrycraft | ........... | H05K 7/1491 211/187 |
| 6,938,967 B2 * | 9/2005 | Dubon | ........... | H05K 7/1489 312/334.44 |
| 6,988,626 B2 * | 1/2006 | Varghese | ........... | G06F 1/16 312/334.4 |
| 7,012,808 B2 * | 3/2006 | Mayer | ........... | H05K 7/1489 361/826 |
| 7,188,916 B2 * | 3/2007 | Silvestro | ........... | A47B 88/43 312/334.4 |
| 7,275,646 B2 | 10/2007 | Mimlitch, III et al. | | |
| 7,350,884 B2 * | 4/2008 | Palker | ........... | H05K 7/1411 312/334.1 |
| 8,083,301 B2 * | 12/2011 | Hudz | ........... | H02B 1/01 312/265.5 |
| 8,207,516 B2 * | 6/2012 | Rees | ........... | G21F 3/02 250/516.1 |
| 8,801,122 B2 * | 8/2014 | Chapel | ........... | H05K 7/1489 312/334.4 |
| 10,034,406 B2 | 7/2018 | Chapel et al. | | |
| 10,314,394 B2 * | 6/2019 | Chen | ........... | H05K 7/183 |
| 10,834,841 B2 | 11/2020 | Chapel et al. | | |
| 10,952,346 B2 * | 3/2021 | Koo | ........... | H05K 7/1491 |
| 2004/0120123 A1 * | 6/2004 | Mayer | ........... | H05K 7/1489 361/725 |
| 2004/0217073 A1 * | 11/2004 | Dobler | ........... | H05K 7/1489 211/26 |
| 2005/0211647 A1 * | 9/2005 | Palker | ........... | H05K 7/1411 211/26 |
| 2005/0212390 A1 * | 9/2005 | Silvestro | ........... | A47B 88/43 312/334.4 |
| 2006/0274508 A1 | 12/2006 | Lariviere et al. | | |
| 2007/0131628 A1 * | 6/2007 | Mimlitch | ........... | A47B 47/024 211/26 |
| 2011/0253914 A1 * | 10/2011 | Rees | ........... | A61B 6/4423 250/516.1 |
| 2012/0091075 A1 * | 4/2012 | Chapel | ........... | H05K 7/1489 211/26 |

OTHER PUBLICATIONS

Prosecution History of U.S. Appl. No. 13/108,838 dated Feb. 12, 2012 through Apr. 9, 2014, 62 pp.

Prosecution History of U.S. Appl. No. 14/327,212 dated Jan. 4, 2016 through Mar. 22, 2018, 72 pp.

Prosecution History of U.S. Appl. No. 16/040,238 dated Jul. 8, 2020, 8 pp.

\* cited by examiner

UNIFORM EQUIPMENT MOUNTING SYSTEM

CROSS-REFERENCE TO RELATED APPLICATION

This application is a continuation of Ser. No. 16/040,238, entitled, "Uniform Equipment Mounting System," filed on Jul. 19, 2018, which is a continuation of Ser. No. 14/327,212, entitled, "Uniform Equipment Mounting System," filed on Jul. 9, 2014, which is a continuation of Ser. No. 13/108,838, entitled, "Uniform Equipment Mounting System," filed on May 16, 2011, which is a continuation of Ser. No. 12/892,009, entitled, "Uniform Equipment Mounting System," filed on Sep. 28, 2010, which is a continuation-in-part of International Patent Application No. PCT/US2009/038851, entitled, "Uniform Equipment Mounting System," filed on Mar. 30, 2009, which claims priority from U.S. Provisional Application No. 61/040,542, entitled, "Uniform Equipment Mounting System," filed on Mar. 28, 2008; U.S. Provisional Application No. 61/040,924, entitled, "Uniform Equipment Mounting System," filed on Mar. 31, 2008; U.S. Provisional Application No. 61/157,118, entitled, "Uniform Equipment Mounting System External Bearing With Integrated Insertion Guide," filed on Mar. 3, 2009; and U.S. Provisional Application No. 61/157,113, entitled, "Uniform Equipment Mounting System Simplified Mechanism With Safety Stop," filed on Mar. 3, 2009. The contents of all of the above-noted applications are incorporated herein by reference as if set forth in full and priority to these applications is claimed to the full extent allowable under U.S. law and regulations.

FIELD OF INVENTION

The present invention relates generally to mounting equipment such as electronic data processing (EDP) equipment in racks and, in particular, to a uniform mounting system that can be used in mounting a variety of EDP equipment having differing widths, depths and mounting structure.

BACKGROUND OF THE INVENTION

EDP equipment is deployed in various environments including residential and business environments. In many cases, multiple pieces of equipment are mounted in a support structure such as a two-post or four-post rack or cabinet, all of which are generally referenced herein as a "rack." In the case of data centers, multiple racks may be configured side by side in rows. It is not uncommon today for such data centers to occupy tens of thousands of square feet.

There is limited standardization of the dimensions of the equipment and the racks, and even less standardization of the mounting structure for mounting the equipment to the racks. In this regard, the NEMA cabinet and rack standard defines a horizontal spacing of the equipment mounting flanges of a rack, a width of the main body of the inserted equipment, a vertical spacing unit (equipment may occupy a multiple of this unit), and a vertical spacing of equipment mounting holes in the vertical support structure of the rack. These standards are more specifically set forth in NEMA publications.

There are no other accepted standard dimensions for racks and equipment. For example, the depth of the equipment to be mounted is not dictated by the standard. In addition, the width of the equipment can vary, and the hardware required for mounting is not standardized.

Moreover, the functionality of the equipment mounting hardware used in NEMA standard and other racks varies. In this regard, there are generally three ways that equipment is mounted in racks. First, the equipment can simply be placed on shelves, which are mounted in the racks. Second, the equipment can be directly mounted to the racks by way of static rack mounting adapters that attach to vertical mounting rails that are either fastened to or are part of the cabinet. Finally, the equipment can be mounted to the rack via rail assemblies that fasten to the vertical mounting rails and allow the equipment to be moved forwardly and rearwardly relative to the rack for improved access.

Many different types of equipment are available from many different manufacturers. Because of the limited standardization noted above, this equipment varies substantially with regard to width, depth, height and rack mounting hardware. The result of this state of affairs is that each manufacturer is responsible for supplying rack mounting hardware that is compatible with the NEMA (or other) standard of the equipment rack. This results in considerable difficulty in installing and accessing the equipment, especially in the case of rack rails because how they attach to the equipment, how far they slide out, how they lock and release, how one removes a piece of equipment from the rack, etc., all vary. This is frustrating to personnel responsible for the equipment, and it is a significant impediment to reconfiguring the layout of equipment and racks as may be desired. For example, in the data center environment, it may be desired to reconfigure racks and equipment for improved efficiency or performance or to accommodate customer changes. However, the difficulty of removing and remounting equipment sometimes weights upon such decisions.

In some cases, the problems caused go beyond inconvenience. Installing or removing certain equipment from a rack may force the removal of adjacent equipment to complete the task. This can require down time, which is difficult to schedule, and it is potentially disruptive and expensive.

The lack of standardization of mounting equipment also results in significant capital expenditures. In particular, it is often necessary to purchase specially designed mounting accessories, such as a rail kit, in connection with the purchase of a piece of equipment. This can be a significant expenditure, particularly in the case of data centers that utilize a large volume of equipment. Moreover, as equipment is added and other equipment is removed and replaced, a large volume of such mounting hardware may be accumulated. Because this mounting hardware is often specially designed for a particular manufacturer and/or a particular piece of equipment, it is difficult to efficiently collect and reuse such mounting hardware. Equipment manufacturers also often intentionally change the design of each rail kit for each new generation of equipment, forcing the purchase of new rail kits which improves their profits. The result is that data centers often accumulate a large volume of mounting hardware, representing a significant capital expenditure, which the data center operator does not know whether to retain.

SUMMARY OF THE INVENTION

The present invention relates generally to mounting equipment such as electronic data processing (EDP) equipment in racks and, in particular, to a uniform mounting system that can be used in mounting a variety of EDP equipment having differing widths, depths and mounting structure. Initially, it should be appreciated that although terms that describe certain orientations (e.g., vertical, horizontal, or the like) are used herein, any suitable reference axes may be used that are appropriate for a particular application. For the purpose of illustration and not limitation, the embodiments described herein show uniform mounting systems that are operative to mount EDP equipment in a vertical stack, although other orientations may also be provided by embodiments of the present invention.

The present invention relates to a mounting system for electronic equipment such as equipment mounted in a two-post or four-post rack in a data center environment. The invention standardizes how equipment is mounted to and positioned in the rack, yet is totally compatible with NEMA or other dimensional standards such as NEMA. The mounting system can be added as an option to suitable existing two or four-post racks or integrated as a part of a two or four-post rack design. It will work with many current standard NEMA dimension two or four-post racks (each variant would have similar features and functions, but different dimensions) or can be used with other standards or custom dimension two or four-post racks. The uniform nature of how the mounting system is designed and functions yields many benefits as will be explained below.

One or more embodiments of the present invention provides a set of structures that includes a number of vertical support posts that have a number of horizontal support rails attached to them at any desired interval (at 1 U=1.75" for example) or pattern of intervals. The structures can be made up of sub-structures in any modulus that may be optimal, for example, in halves, thirds, etc. This may allow for various combinations of sub-structures to be joined together to form a full structure and for the full structure to have different numbers of horizontal rails as needed for different height racks. A pair of the structures may reside on each side of the rack (or may be integrated into the sides of the rack instead of attached to the sides of the rack) to form an equipment mounting assembly. The equipment mounting assemblies allow equipment in the rack to be mounted from the front or the back. In accordance with one aspect of the present invention, a rack can be designed to have vertical sections that match the heights of sub-modules of the assemblies and thereby integrate them into the rack. The various combinations of sub-modules may be combined with the various combinations of rack vertical sections to form racks of any heights that incorporate the mounting system. A possible feature of the design is that this can be done without sacrificing any 1 U mounting positions. A possible use of this capability is described in PCT Application No. PCT/US09/38427 wherein the possibility of constructing modular plug strips for power distribution, modular USB/KVM strips for Universal Serial Bus/Keyboard Video Mouse connections and modular network distribution strips is described. The modular power, USB/KVM and network distribution strips could be constructed in vertical modulus that match the height of the vertical rack sections and facilitate mounting them in the modular rack design.

In accordance with one aspect of the present invention, the assemblies allow different pieces of equipment to be mounted at different horizontal offsets in relation to a front or rear face of a support structure (such as a rack). The assemblies are dimensioned for supporting multiple pieces of electronic equipment in a vertically stacked configuration. The support structure has a front end defining one or more openings where front surfaces of the electronic equipment are disposed adjacent to the one or more openings. For example, the National Electrical Manufacturing Association (NEMA) cabinet and rack standard defines the spacing of conventional vertical mounting flanges for defining this front opening. The system further includes first mounting structure for mounting a first piece of equipment in a fixed position in relation to the support structure so that a first front surface of the first piece of equipment has a first horizontal offset in relation to the front end of the support structure, and a second mounting structure for mounting a second piece of equipment in a fixed position in relation to the support structure so that a second front surface of the second piece of equipment has a second horizontal offset, different than the first horizontal offset, in relation to the front end of the support structure. The system may include additional positioning structures so that each piece of equipment in the support structure can have an individually selected horizontal offset. In this manner, equipment having different depths can be accommodated or differing horizontal offsets can be supported for any reason desired by a user.

In accordance with a further aspect of the present invention, a method is provided for changing a horizontal offset of a piece of equipment with respect to a support structure. The method involves providing a support structure having a rail assembly and providing a piece of electronic equipment. The piece of electronic equipment is then secured to a mounting structure. The method further involves inserting the piece of electronic equipment into the support structure by slidably engaging the mounting structure and the rail assembly. A horizontal position of the piece of electronic equipment is then fixed in relation to the support structure at a first location. The method further involves sliding the mounting structure in relation to the rail assembly so that the piece of electronic equipment is disposed at a second location in relation to the support structure and fixing the electronic equipment at the second location. The position of the electronic equipment can be fixed at a number of locations (e.g., discrete locations) so as to provide a range of possible horizontal offsets.

In accordance with a still further aspect of the present invention, a method is provided for use in moving electronic equipment. The method involves providing a support structure having a number of vertically spaced rail assemblies and having a piece of electronic equipment. The piece of electronic equipment may be secured to a mounting structure. The piece of electronic equipment can then be inserted into the support structure by slidably engaging the mounting structure and a first one of the rail assemblies. Conversely, the piece of electronic equipment can be removed from the support structure by slidably disengaging the mounting structure and the first rail assembly. The piece of electronic equipment can then be re-inserted into the support structure by slidably engaging the mounting structure and a second one of the rail assemblies. In this manner, the electronic equipment can be moved to a different vertical location within the support structure without detaching the equipment from the mounting structure and without the need for tools. Similarly, the equipment can be moved from one support structure to another support structure in accordance with the present invention. In accordance with one aspect of the present invention, the assemblies allow for NEMA standard (or other desired standard or custom) mounting rails to be mounted horizontally (either front to back on the sides of the rack or side-to-side across the rack) in the assembly. This allows NEMA standard equipment that can benefit from such an arrangement, for example patch panels to be mounted side-by-side vertically in the rack at a given vertical height, but still be able to be removed from the rack.

In accordance with one aspect of the present invention, the assemblies allow for equipment to be mounted horizontally in the rack but be wider than the NEMA standard. This is possible because the assemblies on each side of the rack are spaced wider than the NEMA standard so that a variety of equipment widths that are at or below the maximum width that is compatible with the NEMA standard unitary vertical mounting rails. The segmented vertical rail design allows equipment to use the space between the maximum NEMA width and the location of the slider on each side of the rack. This is the case because the equipment can be designed to mount to the sliders in such a way that it does not have to pass between a NEMA defined opening between the unitary vertical mounting rails.

In another aspect of the invention, the horizontal support rails can have an integrated uniform latching mechanism on one or both ends that allow a user to adjust and secure the position of one or more adjustable sliders on the horizontal rail. The uniform nature of the latching mechanism is a feature that allows any equipment with integrated sliders or other mechanisms to be freely moved between the horizontal rails in the racks or between multiple racks. The slider can be a separate piece or integrated into the design of equipment or accessories that are designed to mount into the assembly by sliding onto the horizontal rails. The adjustability of the horizontal sliders allows for mounting of a piece of equipment attached to the slider at a selected horizontal offset position in relation to a front end of a support structure such as a rack and allows different pieces of equipment to be supported at different horizontal offsets in relation to the front end of the mounting structure. In another aspect of the invention, the integrated uniform latching mechanism can be implemented to be uniform in how it works, how it is operated (e.g., same user interface for every slider) and can be very convenient to use. Since all the slider interfaces to the horizontal support rail are uniform and attach to the rack in the same way, the release mechanism can be designed to be the same for all sliders, regardless of their other details.

The release mechanism may also release, one, many or all of a set of sliders. It is practical to design a release mechanism this way because of the uniform design of the slider latch mechanism.

In another aspect of the invention, the release mechanism can be made as follows to be easily accessible to the user. Standard cabinets often have equipment-mounting flanges that are attached to the structural supports of the equipment cabinet such that there is little or no gap between the equipment mounting flanges and the support. The result of this fact is that most equipment vendors build rack mount rail systems that require the user to reach into the cabinet and press a button or toggle a lever to release the equipment from a locked position. This is very difficult in a fully loaded rack. The user must reach around the side of the equipment mounting flange and attached support and activate the release button or lever. In some cases, it is impossible to do w/o removing the equipment that is mounted above or below the equipment the user wishes to remove. If this is the case, the data center manager must leave a space above or below the affected equipment thus wasting that rack space.

If the mounting system is designed as an option to an existing cabinet, there can be clearance to place a uniform release mechanism (button, lever, etc.) that is located between the edge of the front opening of the rack and the back (side away from where the equipment attaches to the slider). This is because the slider support assemblies and associated sliders attach to the cabinet structure in a way that this space is available for a uniform release mechanism to occupy. This puts the release mechanism on the front and back of the cabinet in an easy to use location where it is visible and simple to see how to use it (the user interface, or UI). In addition, the release mechanism latch lever is designed to be easily installed or removed from horizontal rail assemblies as needed. This is useful in minimizing the number of latch assemblies required, thus lowering costs.

If a system is designed to be integrated into the cabinet, then the cabinet can easily be designed to place the release mechanism in the front and/or back of the cabinet, in an easy to use location. This is only practical due to the uniform nature of the system, since the sliders have standardized attachment and latching mechanisms and can be designed to be released in a uniform manner.

In accordance with another aspect of the invention, the adjustable sliders can be made in different lengths and used in pairs on each side (e.g., two sliders on each rail) of a piece of equipment to mount the equipment to the pair of assemblies on the side of the rack. This "split-slider" feature allows equipment of different sizes to be mounted with a minimum of different length sliders. In other words, the sliders may work in dual pairs, one pair per side per 1 U (note that equipment that is relatively short in depth may be mounted using only two sliders).

In accordance with another aspect of the invention, the adjustable sliders can be made as compound sliders, e.g., a slider including two or more sections that can telescope to a length that is greater than any one of their sections. One half of the compound assembly could be assembled as part of the horizontal rail, or both or multiple parts of the compound slider can be assembled in the slider section only.

In accordance with another aspect of the invention, equipment that is large and heavy, or shelves, trays and accessories, etc. intended to support high loads (especially loads that may be higher than the load rating of a single pair of sliders in 1U of rack space, or loads that may be generated by dynamic forces, such as when a rack is mounted in a mobile environment, such as a truck, ship or airplane, etc. or an unstable environment, such as an earthquake zone) can be attached to multiple sliders to divide the load over the multiple sliders and horizontal rails when the equipment, shelves, trays or accessories, etc. are inserted into the assembly and engage multiple horizontal rails. In the case of existing equipment, trays, shelves, etc., this can be done by attaching multiple sliders per side to the equipment and then engaging multiple horizontal rails when slidably inserting the equipment into the assembly. Alternatively, it can be done by using mounting adapters that engage more than 1 U of mounting holes, or using multiple mounting adapters. Alternatively, for equipment with integrated sliders, trays, accessories, etc. multiple sliders per side that will engage multiple horizontal rails per side may be provided.

In accordance with another aspect of the invention, the sliders can be designed to mount in either orientation onto the horizontal sliders. This allows equipment to be put into the rack from either the front or back. It also allows the equipment to be removed from the rack and reversed 180 degrees and remounted in the rack. In this regard, it may be useful to be able to access either the front or back of the equipment from either the front or back of the rack.

In accordance with another aspect of the invention, a universal mounting adapter can be provided to attach equipment to a slider or one or more pairs of sliders. The universal mounting adapter may include an equipment standoff that attaches to the slider and is in the shape of an "L" where the bottom of the "L" has a pattern of parallel-aligned angled slots. Further, the universal mounting adapter may be supplied as a universal or equipment specific mounting adapter that attaches to the side (or top, bottom, front, or rear) of the equipment being mounted. If the mounting adapter is equipment specific, it can be designed with one or more holes (or other equipment specific attachment arrangements such as slots, pins, etc.) to mate to one or more specific models of equipment. It may be made in the shape of an "L" where the bottom of the "L" has a pattern of parallel-aligned angled slots. The bottom of the "L" of the equipment standoff is attached to the bottom of the "L" of the equipment mounting adapter so that together they form a "U" where the width of the "U" is adjustable. This is facilitated by the arrangement of the parallel angled slots in both or either of the equipment standoff and/or the equipment mounting adapter. The slots may be laid out according to a logarithmically based spacing that insures that one of the slots in the equipment standoff will always align with a slot on the universal equipment mount. This allows a fastener such as a bolt and nut to be used to secure the equipment standoff and the equipment mounting adapter together. This universal mounting adapter can therefore be used to accommodate a variety of equipment with different hardware (or none) for attaching rail kits to the equipment. It also can accommodate equipment of different lengths, widths and depths. The mounting adapters can be used in whatever number is needed to mount the equipment.

In accordance with another aspect of the invention, a mounting adapter that is specific to one or several models of equipment can be provided to attach equipment to a slider or one or more pairs of sliders. The model specific mounting adapter can be formed in the shape of a "U" where one side of the "U" attaches to the slider, and the other side of the "U" is configured to attach to the equipment. The width of the mounting adapter may be specific to the model or models of equipment being mounted. The mounting adapters can be used in whatever number is needed to mount the equipment.

In accordance with another aspect of the present invention, a mounting system includes a segmented vertical mount rail. Conventionally, electronic equipment has been mounted to a pair of vertical mount rails at the front of a support structure, either directly, using right angle brackets, or via a rail kit. The present inventors have recognized that this unitary rail design limits mounting functionality. Accordingly, the inventive system includes a support structure, dimensioned for supporting multiple pieces of electronic equipment in a vertically stacked configuration and a vertically segmented rail assembly interconnected to the support structure. The vertically segmented rail assembly includes a first rail segment subassembly for mounting a first piece of electronic equipment and a second rail segment subassembly, vertically offset from the first rail segment subassembly for mounting a second piece of electronic equipment. The first rail segment subassembly is horizontally moveable in relation to the second rail segment subassembly. For example, one or both of the first and second rail segment subassemblies may be independently moveable along a front-to-back axis horizontal element of the support structure.

The invention provides the vertical segmented mounting rail with NEMA standard mounting holes (or other desired standard or custom dimension or attachment hardware) that can be attached to an end or ends of the adjustable slider to provide compatibility with NEMA standard mounting adapters, accessories (trays, shelves, cable management accessories, etc.) and rail mount kits for conventional NEMA racks. As noted earlier, the NEMA standard specifies the hole locations in vertical mounting rails but does not specify the fastener type to be used with the holes. Therefore the vertical segmented mounting rail can be made with any needed fastener types (such as $^{12}/_{24}$ threads, $^{10}/_{32}$ threads, or $^{3}/_{8}"$ square holes for cage nuts) or any desired custom hardware or other standard hardware. That is, any vertical, segmented mounting rails with varying fastener types may be intermixed in the same rack assembly as needed. It should be noted that any equipment, shelf, accessory, etc. thus attached to a segmented vertical mounting adapter that is mounted to a slider is thereby made horizontally adjustable and can be moved from one (or more than one if the equipment is more than 1 U high and attaches to several vertical segmented mounting rails) horizontal rail to another in the same rack or a different rack without tools.

An optional embodiment of the vertical segmented mounting adapter may include a vertical or horizontal hinge. This allows equipment that is mounted via the vertical segmented mounting adapter to be pivoted to gain access for servicing or other needs.

An alternative embodiment and usage of the vertical segmented mounting rail is to attach it directly to a horizontal support element of an assembly that is adapted for that purpose. In such an embodiment, the horizontal support rails may be replaced by a simpler and/or lower cost mechanism, such as a horizontal slot. This may allow the vertically segmented mounting rail to be attached to the assembly and to be adjusted in its horizontal offset, but may dispense with the expense of a horizontal rail, latching mechanism and adjustable slider. This embodiment may be suitable for many applications.

In accordance with another aspect of the invention, a lock or other security mechanism can be incorporated into the structure of the assembly to prevent the movement and/or removal of adjustable sliders (and the equipment or accessories attached to them) from the rack. The lock can engage one, some, or all of the sliders disposed on the horizontal rails of the assembly.

In accordance with another aspect of the invention, a lock can be incorporated into the adjustable slider and/or the adjustable slider with attached vertical segmented mounting rail to prevent the movement and/or removal of adjustable sliders (and the equipment or accessories attached to them) from the rack.

According to another aspect of the present invention, an apparatus is provided for use in mounting a piece of equipment into an equipment rack. The piece of equipment is pre-mounted onto a slider mechanism as discussed above. The noted apparatus includes a guide structure for guiding the sliders onto the rails and mounting structure for mounting the guide structure onto the rack such that the guide structure is positioned to guide the sliders into an engaged relationship with the support rails. In this regard, the guide structure preferably extends forwardly beyond a forward end of the support rails. In addition, the guide structure may be tapered at a front end thereof to provide clearance between vertically adjacent guide structures so as to facilitate placement of a slider mechanism onto the desired guide structure. A corresponding method involves providing a guide structure mounted on the rack, disposing a rearward portion of a slider mechanism on the guide structure and rearwardly advancing the sliders so that a rearward portion of the slider mechanism engages a forward portion of the support rails, and progressively rearwardly advancing the sliders in relation to support rails to a fully engaged position.

In accordance with another aspect of the present invention, an apparatus is provided for enhancing the load bearing rating of an equipment rack. The rack may include support rails that engage slider mechanisms as described above. The apparatus includes a support bearing, external to the support rails, for supporting at least a portion of a load of the piece of equipment and allowing for sliding movement of the slider mechanism in relation to the support rail, and mounting structure for mounting the support bearing on the rack in relation to the support rail such that support for the load of the piece of equipment is shared as between the support rails and support bearing for at least one position of the slider with respect to support rails. Preferably, the support bearings are dimensioned and positioned such that, when slider mechanisms are placed on each of the rails within a rack, the support bearing is in contact with or closely spaced in relation to vertically adjacent slider mechanisms. In this manner, the load rating of the rack is enhanced as may be desired for certain environments such as where the rack is subject to acceleration or heavy equipment is utilized in connection with the rack.

In accordance with a still further aspect of the present invention, a safety stop mechanism is provided for use in connection with slidably mounted equipment of a rack. The apparatus includes a slider mechanism mounted to the piece of equipment, a support rail assembly for receiving the slider mechanism, and a locking mechanism for selectively locking the slider mechanism on the support rail assembly. The locking mechanism is movable between the first position where the slider mechanism can be fully removed from the support rail assembly and a second position where a range of motion of the slider mechanism with respect to the support rail assembly is limited. In one implementation, the locking mechanism is operative for preventing accidental removal of the slider mechanism from the support rail assembly and is also operative to allow selection of the desired offset configuration of a piece of equipment with respect to the rack.

In accordance with a further aspect of the present invention, a mounting fixture that is separate from the rack and can be located in a suitable location such as on a table or roll-around cart is provided for mounting slider assemblies to a piece of equipment or shelves, trays, accessories, etc. This may simplify and increase safety in the workplace since the actions associated with mounting the adapters and sliders can be performed at a convenient height on a suitable and secure surface, where access to the hardware is easy and tools may be easily used. It is noted that this is in contrast to the conventional methodology where rack mounting adapters or rail kits require the user to attach components to the rack which may already be full of equipment and have very poor lighting and access for use of hands and/or tools. As noted above, the present invention allows a slider assembly to be pre-mounted to a piece of equipment. The slider assembly with mounted equipment can then be taken to a rack where the equipment is inserted on to support rails at the desired location. The noted fixture facilitates this functionality by enabling convenient mounting of the slider assembly to the equipment. In this regard, the fixture includes a support surface for supporting the equipment in defined spatial relationship to rail mounts. The rail mounts are spaced by a distance matching the spacing of rails in the target rack. The fixture can be used by placing a piece of equipment to be mounted on the support surface and inserting slider assemblies on the rail mounts. Mounting hardware can then be applied to the equipment and slider assembly to interconnect the equipment to the slider assembly. In one implementation, an elevator mechanism is associated with the support surface to allow vertical movement of the support surface in increments matching the vertical spacing of support rails in the target rack. In this manner, mounting of multiple u equipment is facilitated by conveniently allowing multiple sliders to be attached to each side of the equipment.

BRIEF DESCRIPTION OF THE DRAWINGS

For a more complete understanding of the present invention and further advantages thereof, reference is now made to the following detailed description taken in conjunction with the drawings in which.

DETAILED DESCRIPTION

In the following description, the invention is set forth in the context of a specific rack system configuration for use in a data center or similar environment for mounting EDP equipment. The invention has particular advantages for this environment due to the large volume of equipment, the variety of equipment and the likelihood of periodic reconfiguration of equipment and rack layout in such environments. However, it will be appreciated that various aspects of the invention are more broadly applicable to other equipment mounting environments and in connection with other types of equipment. Accordingly, the following description should be understood as illustrating the invention and not by way of limitation.

Figure 1:
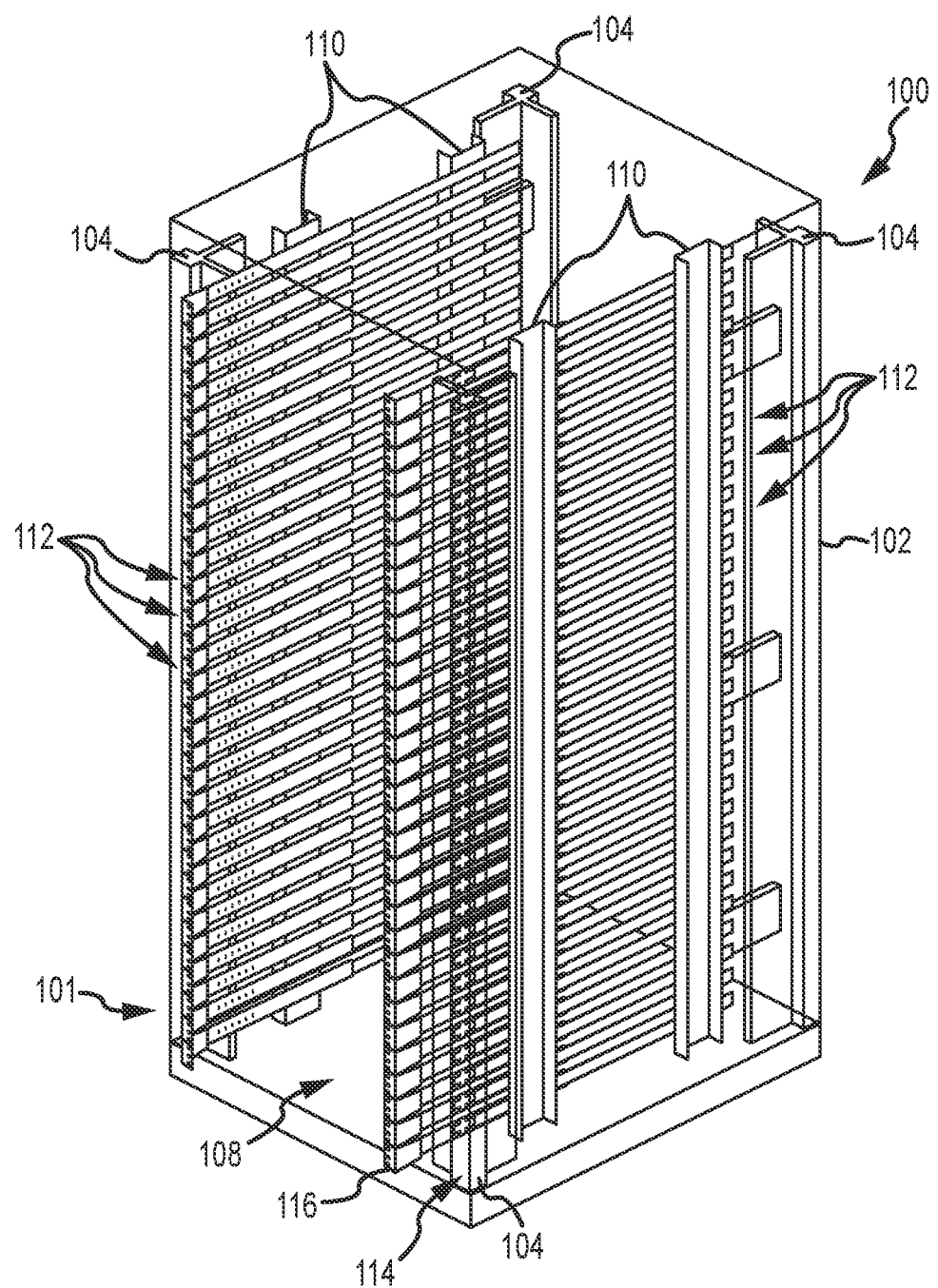
FIGS. 1 and 2 illustrate perspective views of a rack system in accordance with the present invention.
Figure 2:
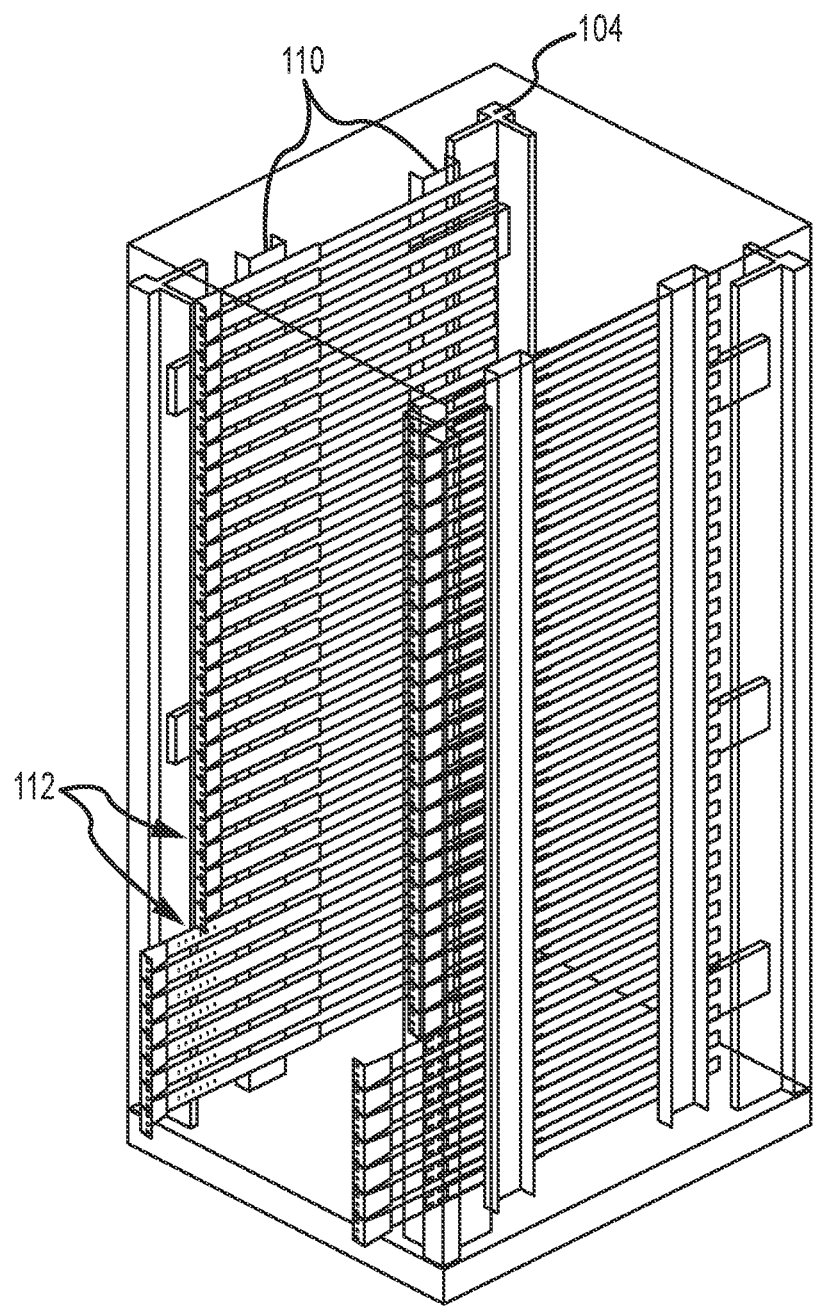
Figure 3:
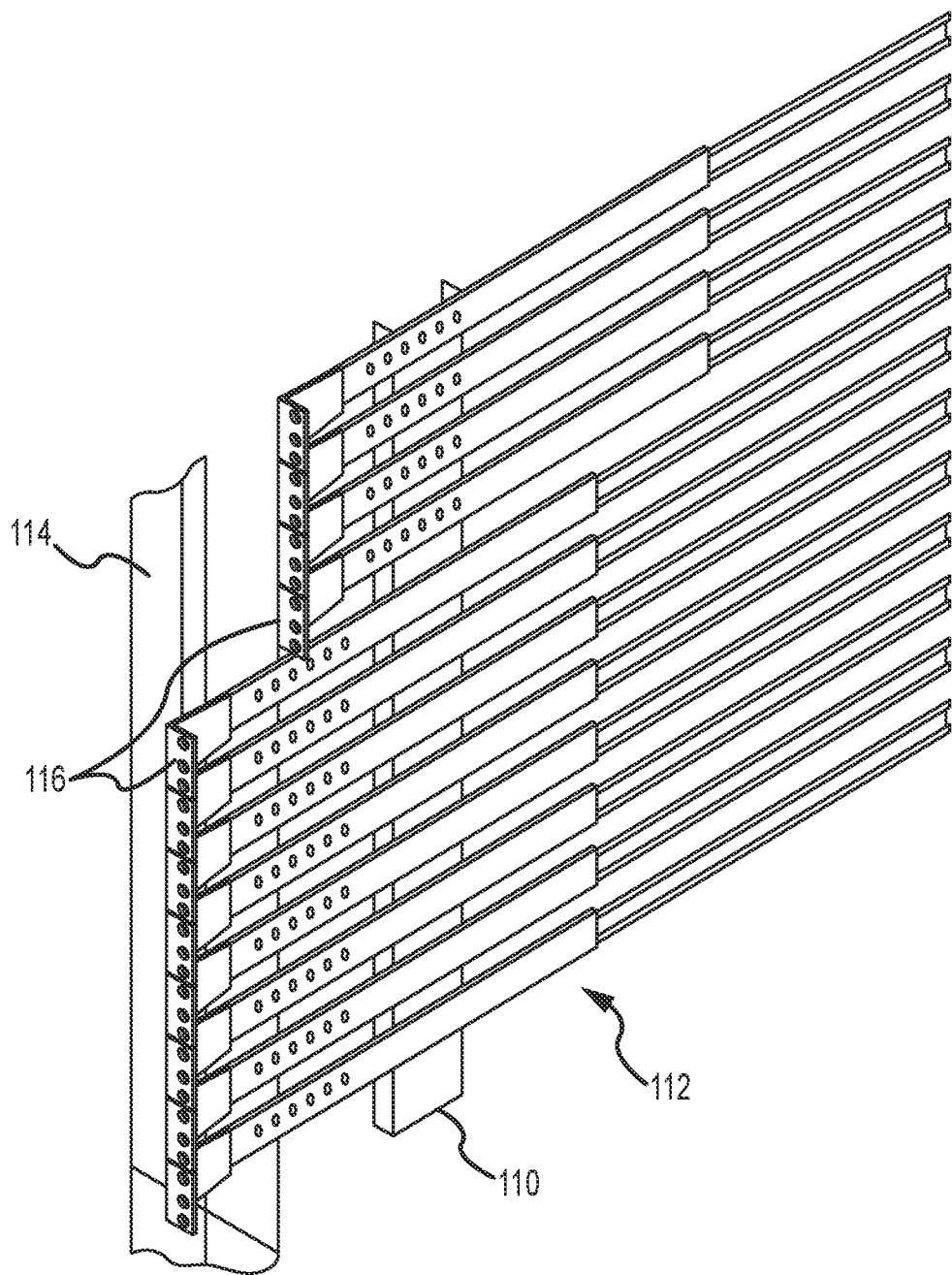
FIG. 3 is a cut-away perspective view showing rail and slider assemblies of the system of FIG. 1.

Referring to FIG. 1, a perspective view of a rack 100 including a uniform mounting system 101 in accordance with the present invention is shown. Additional details of the rack 100 and configurations are shown in FIGS. 2 and 3. It will be appreciated that the present invention can be utilized in connection with a wide variety of rack configurations including two- and four-post racks, open racks and enclosed cabinets or any other suitable configuration. In the illustrated embodiment, the rack 100 includes four corner posts 104 and an enclosure structure 102. The rack 100 may include additional structure elements such as bottom and top surfaces and braces that are not labeled in FIG. 1. The illustrated rack 100 further includes a front opening 108 through which equipment can be accessed and can be inserted into and removed from the rack 100. In some cases, a front door may be provided to enclose the opening 108 though this may interfere with certain equipment offset configurations, as will be understood from the description below. The back side of the cabinet 100 opposite the front opening 108 may be open or may include an access door. In this regard, it is typically desired to be able to access the rear side of the mounted equipment for servicing. Though not shown, it should be appreciated that fans or other cooling devices may be provided in connection with the rack 100. For example, components of such a cooling system may be mounted in a front and/or rear door of the cabinet 100.

The illustrated rack 100 further includes a number of rail and slider assemblies 112, as will be described in more detail below. As shown in FIG. 1, these rail assemblies are vertically distributed across the height of the rack 100. In the illustrated embodiment, the vertical separation between adjacent rack and slider assemblies 112 is approximately 1 u. It should be appreciated that larger and heavier equipment may occupy more than 1 u of rack space. Accordingly, in such cases, such equipment may be mounted to multiple ones of the rail and slider assemblies 112, thereby supporting the equipment by splitting the load over multiple rail and slider assemblies 112.

The rail and slider assemblies 112 are mounted to the rack 100 via side support posts 110. In the illustrated embodiment, two side posts 110 are provided on each side of the rack 100, though the number and spacing of the posts 110 can vary. The various elements of the rack 100 are manufactured from materials and are otherwise engineered to support the weight of equipment mounted and rack and to otherwise endure in a data center environment. Typically, the rack 100 may be manufactured from steel with appropriate thickness and structural reinforcement for this environment, although other materials such as aluminum can be used.

As noted above, the uniform rack mounting system 101 accommodates a variety of equipment. This includes options to mount equipment of varying widths. For example the uniform rack system can be adapted to mount equipment conforming to the 19" NEMA standard width (the most common) or a different option can be adapted to mount equipment conforming to the 23" NEMA standard width. Further, in the 23" width option, 19" NEMA standard width equipment can be accommodated in the same 23" width rack. Mounting adapters for accommodating such variations will be described in more detail below. In this regard, the rail and slider assemblies 112 disposed on opposite sides of the rack 100 are separated by a distance that is suitable to accommodate such equipment and allow a range of adjustment via the mounting adapter as described below. To accommodate varying equipment depths, the rail and slider assemblies allow for mounting of equipment at varying offsets. Such offsets relate to the relative positions of the rack front surface 114 in relation to the mounting flanges 116 of the rail and slider assemblies 112. The vertically segmented mounting flanges 116 typically attach directly to the front surface of the mounted equipment and therefore define the position of the front surface of the equipment. In this regard, the rail and slider assemblies 112 allow equipment to be mounted with a positive offset, a neutral offset or a negative. Positive offset refers to configurations where, when equipment is mounted, the associated mounting flanges 116 are disposed forwardly of the front surface 114 of the rack 100. In negative offset configurations, the relevant mounting flanges 116 are disposed rearwardly of the front surface 114. In neutral configurations, the mounting flanges 116 are substantially flush with the front surface 114.

FIG. 2 shows varying offset configurations in this regard. The rail and slider assemblies 112 have a telescoping arrangement that accommodates such varying offsets. In addition, the rail and slider assemblies 112 may be manufactured in different lengths to further accommodate such variations in offset as well as to accommodate a desired range of forward and rearward sliding movement of the equipment in relation to the rack 100 so as to accommodate servicing as well as removal and insertion of the equipment relative to the rack 100 through either a front opening 108 or rear opening of the rack 100. Such sliding of the equipment through a rear opening of the rack is a unique feature of the present invention. The variable offset capability is also a unique feature of the invention.

Conventionally, racks have included a continuous vertical mounting rail on each side of the front and/or back of the rack. The front surface of equipment was typically directly mounted to this rail. In the illustrated rack 100, equipment is mounted to the mounting flanges 116 that effectively define a segmented mounting rail. That is, each mounting flange 116 is associated with one of the rail and slider assemblies 112 and can be independently moved in relation to the front-to-back depth axis of the rack 100. This accommodates the varying offsets as shown in FIG. 2. In addition, this allows equipment to be slideably moved forwardly and rearwardly relative to the rack 100, and allows equipment to be inserted into the rack 100 and removed therefrom while the equipment remains mounted to the mounting flanges 116.

The illustrated rack 100 also accommodates variations in mounting structure (e.g., the size and spacing of threaded bolt holes). As noted above, the front surface of equipment is often mounted directly to the rack. In conventional racks, the front surface of the equipment may be bolted to the continuous vertical mounting rail. In the illustrated rack 100, the equipment is mounted to the mounting flanges 116. Unfortunately, the hardware required for such mounting is not standardized. In particular, different equipment may require different types of bolts and different spacing of the openings for receiving the bolts. In the illustrated embodiment, the mounting flanges 116 can be adapted to accommodate these variations. In this regard, the mounting flanges 116 may include an array of openings to accommodate the most common configuration in this regard, or the mounting flanges 116 may be interchanged depending on the equipment to be mounted. In the illustrated embodiment, different ones of the mounting flanges 116 are interchangeable and have different configurations in this regard, e.g., differently shaped (e.g., round or square) openings and different spacings.

The illustrated rack 100 also accommodates equipment of different widths in relation to a side-to-side dimension of the rack 100. It will be appreciated that equipment is often mounted to the rack not only by way of the front surface of the equipment but also in relation to the side surfaces of the equipment. This is particularly useful in connection with equipment mounted so as to slide in and out of the rack. In this regard, equipment typically includes mounting structure on the equipment sides that, in the past, has been used to mount the equipment to corresponding structure of a specially designed rail kit. In the illustrated embodiment, the same mounting structure of the equipment can be used to mount the equipment to the structure of the rail and slider assemblies 112, as will be discussed in more detail below. Again, the existing mounting structure varies from case to case. In addition, different pieces of equipment can have different widths.

Figure 4A:
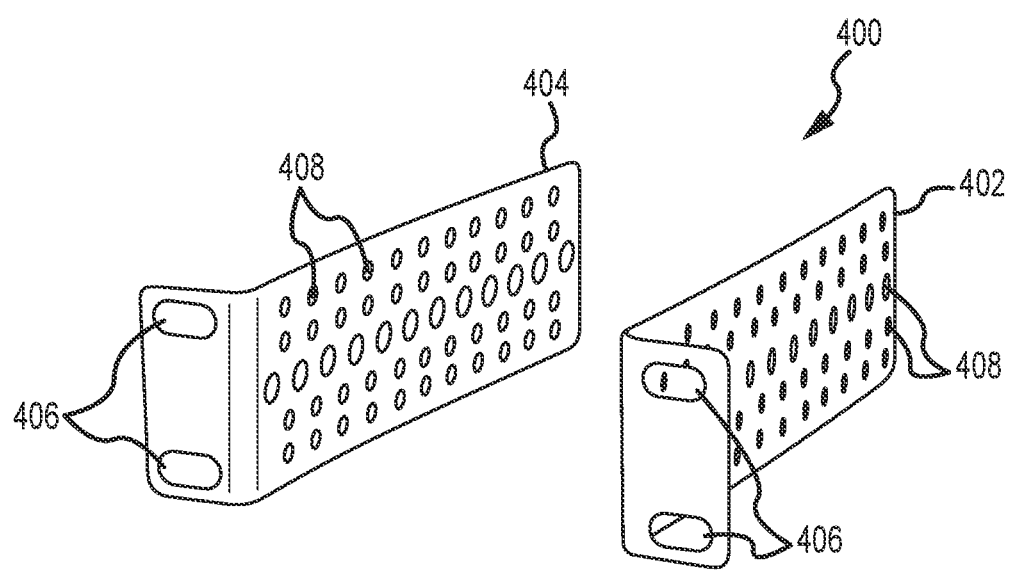
FIGS. 4A-4B are perspective views showing alternative equipment mounting adapters for use in the system of FIG. 1.

Accordingly, as shown in FIG. 4A, universal equipment mounting adapters 400 can be used to mount the equipment to the rail and slider assemblies 112. Generally, the mounting adapter assembly 400 can be reconfigured to accommodate equipment of different widths and includes mounting structure for mating to different types of equipment. The illustrated assembly 400 includes first and second L-shaped mounting adapters 402, 404. One of the brackets 402 or 404 is bolted to a piece of equipment by way of openings 406 formed on a base thereof, and the other mounting adapter 402 or 404 is attached to a slider of the rail and slider assembly 112 by installing a bolt through the openings 406. In this regard, an array of openings 406 may be provided to accommodate different mounting configurations of different equipment, or custom mounting adapters may be provided for different types of equipment. The illustrated brackets 402 and 404 further include an array of openings 408 distributed along the length of the side portions of the brackets 402, 404. It will be appreciated that the two brackets 402, 404 are interconnected by bolts or the like to connect the equipment to the rail and slider assembly via the vertical segmented mounting flanges. The array of openings 408 allows for appropriate selection of the overall length of the interconnected brackets 402, 404 so as to accommodate equipment of varying widths.

Figure 4B:
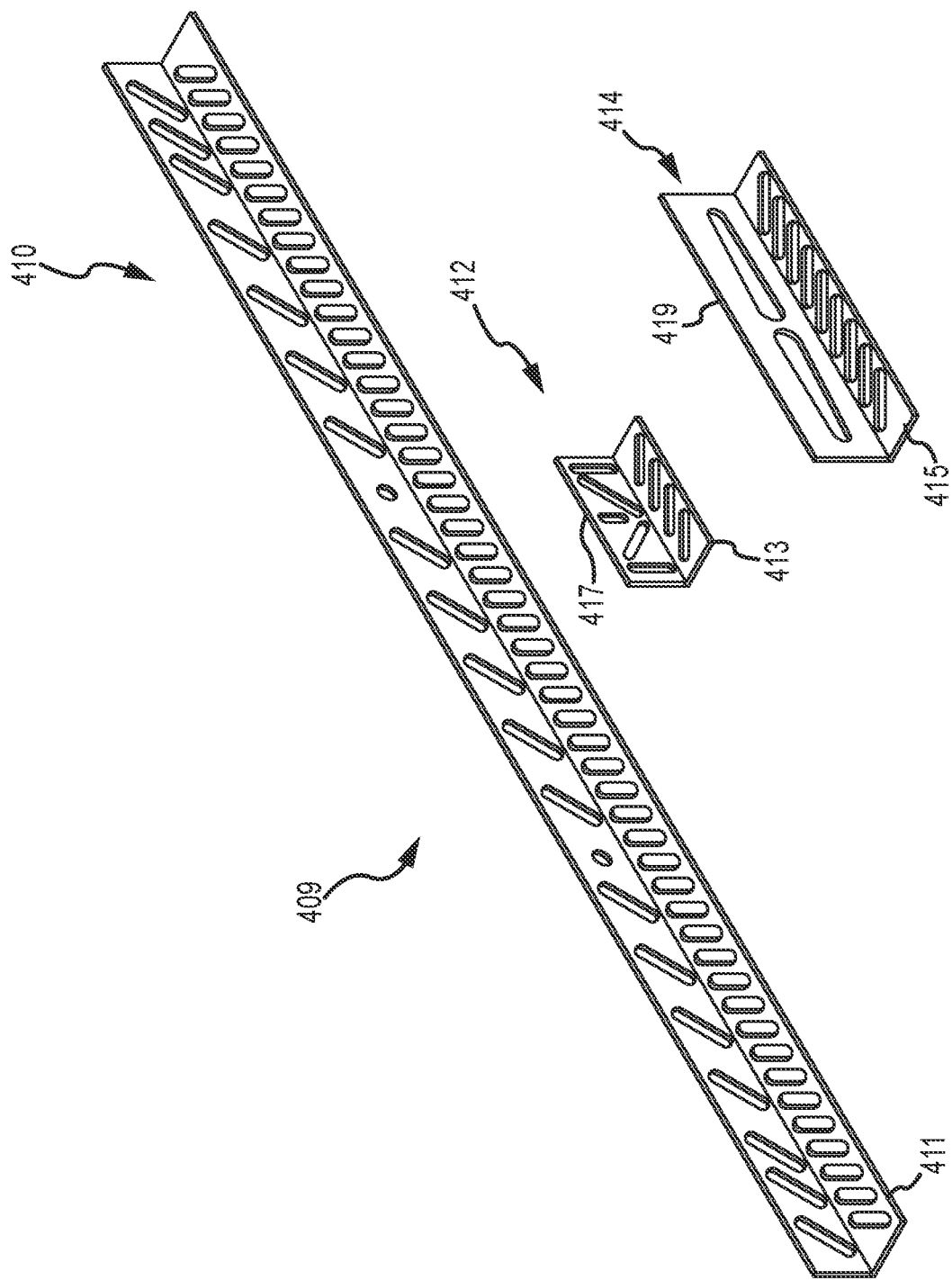

FIG. 4B shows an alternate configuration of a mounting adapter assembly 409. In this case, the assembly 409 includes a slider standoff 410 for attachment to the slider and two different equipment mounting adapters 412 and 414 for attachment to the equipment. Once the slider standoff 410 is attached to the slider and the equipment mounting adapter 412 or 414 is attached to the equipment, the slider standoff base 411 can be bolted to the equipment mounting adapter base 413 and 415. The diagonal arrangement of the slots on the bases 411, 413 and 415 ensures that the slots can be aligned to allow bolting and also allows significant adjustment of the width of the resulting bracket. The vertical leg 417 of adapter 412 has a variety of slots to match up with the mounting structure of a variety of equipment for bolting. The teardrop shaped openings of the vertical let 419 of standoff 415 can receive the heads of mushroom shaped mounting pins, provided on some equipment such that the heads cannot easily become dislodged from the opposing teardrop openings. That is, the illustrated bracket assembly works in connection with a variety of equipment so that the need for custom bracket assemblies for individual pieces or types of equipment are reduced.

Figure 5:
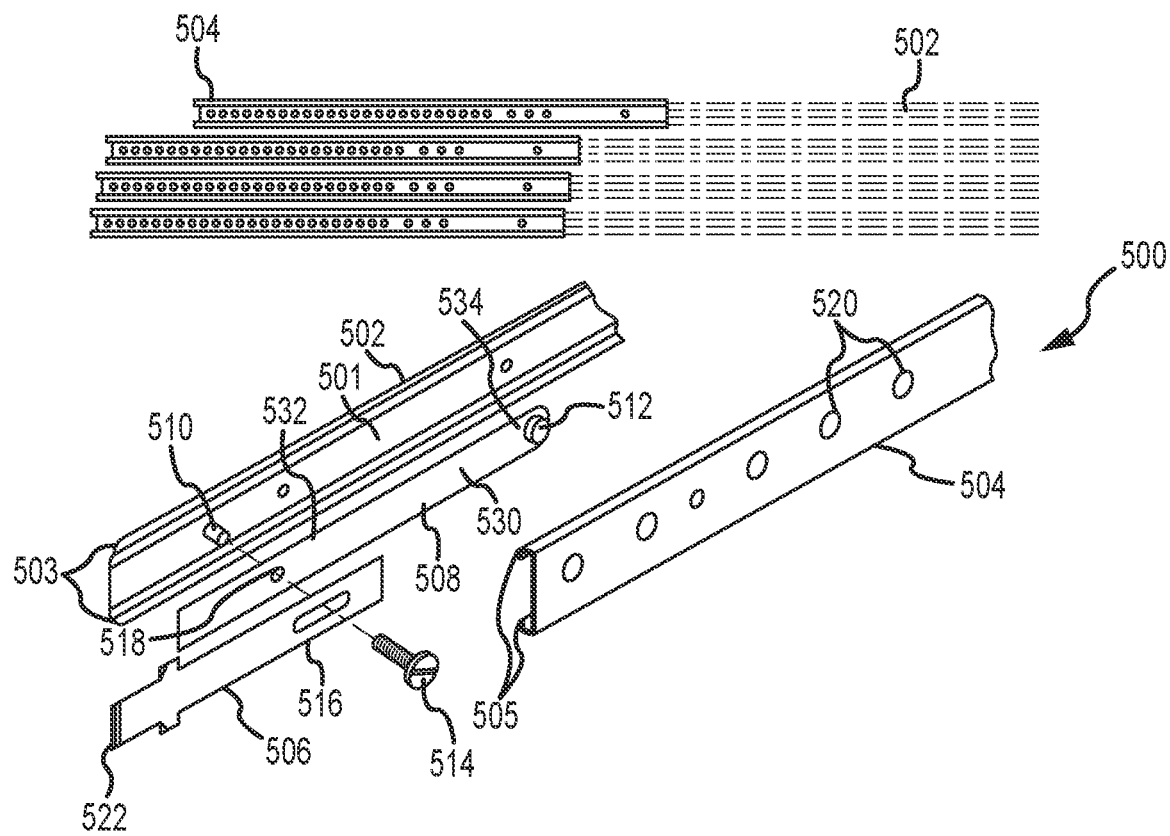
FIG. 5 is an exploded view showing a safety stop mechanism for use in the system of FIG. 1.
Figure 6:
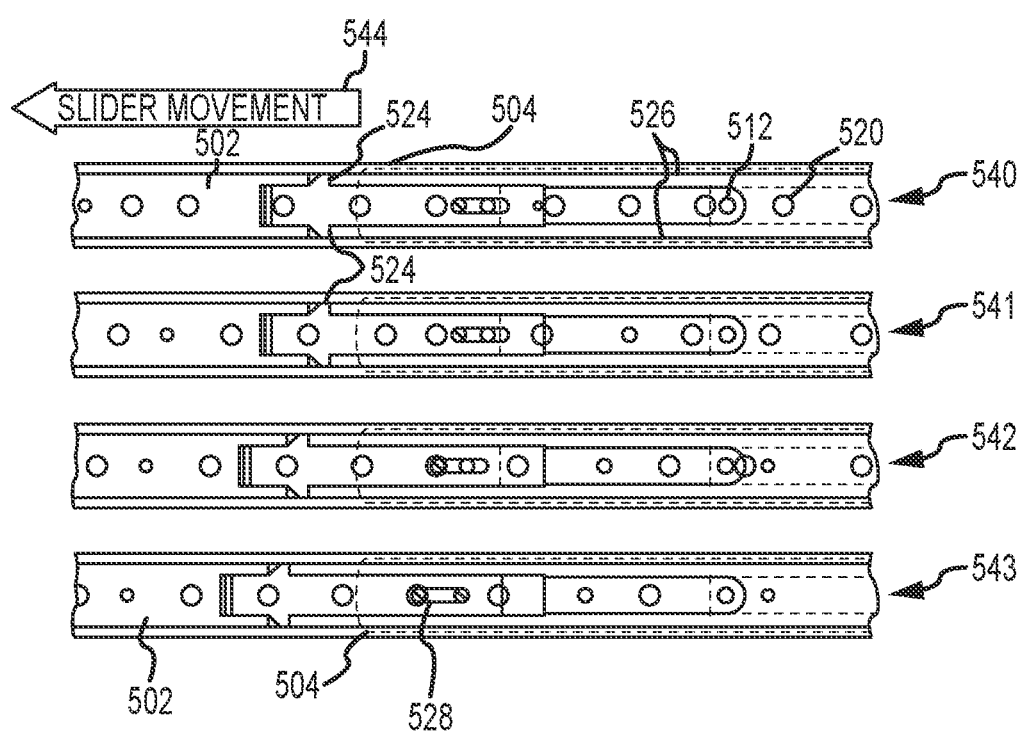
FIGS. 6 and 7 illustrate operation of the safety stop mechanism of FIG. 5.
Figure 7:
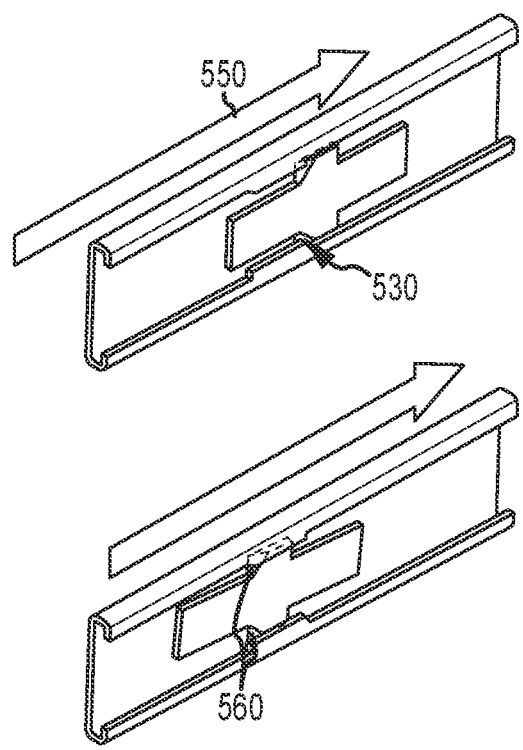

FIGS. 5-7 show details of a safety stop assembly 500 used in connection with the rail and slider assembly. The safety stop assembly 500 performs a number of functions. First, as noted above, the rail and slider assembly can be configured to accommodate a variety of different offset configurations. In this regard, the safety stop assembly 500 can lock the relative positions of a horizontal rail 502 and a slider 504 to define the desired offset configuration. As shown, the rail 502 includes a base area 501 for mounting to the side posts 110 (See FIG. 1) and flanges 503. The slider 504 includes flanges 505 that engage the flanges 503 of the rail 502 so that the slider 504 can slide forwardly and rearwardly on the rails 502. The components of the safety stop assembly 500 may be symmetrical, such that each part may be used on either side (e.g., right or left) of the assembly 500. This feature may reduce manufacturing costs as well as simplify assembly of the system in the field by a user.

The safety stop assembly 500 functions to limit movement of the slider 504 in relation to the rail 502. The assembly 500 includes an actuator 506 and a spring 508 with retention puck 512. A screw 514 extends through a slotted opening 516 of actuator 506 and opening 518 of spring 508 into threaded stud 510 mounted on rail 502 so as to connect the actuator 506 and spring 508 to the rail. The puck 512 is dimensioned to drop into any one of the openings 520 on the slider 504 so as to substantially lock the relative positions of the rail 502 (and, in turn, the rack) and the slider 504 at the position defined by any one of the openings 520. In this matter, any desired equipment offset configuration can be locked in. Although a round puck 512 and round openings 520 are shown, any cooperating geometry (e.g., matching shapes) could be employed in this regard.

It will thus be appreciated that relative motion between the rail 502 and slider 504 is allowed when the puck 512 is withdrawn from the opening 520 and is substantially prevented when the puck 512 is engaged in one of the openings 520. The illustrated actuator 506 interacts with the spring 508 in two different ways to actuate movement of the puck 512 into and out of the opening 520. First, the latch handle 522 can be moved between locked and unlocked positions to selectively allow movement of the slider 504 and attached equipment. The actuator 506 and spring 508 are configured in relation to the rail 502 and slider 504 so that, for a particular screw position in the opening 516, as will be discussed momentarily, the puck is biased by the spring 508 against the slider 504. Accordingly, the slider 504 will move only a short distance in relation to rail 502 until the puck 512 finds an opening 520. An offset configuration is then locked in place. The user can fine-tune this offset configuration by moving the latch handle 522 to the unlocked position and sliding the slider 504 and equipment in the desired direction until the puck 512 finds the next opening 520. This first way of interaction between the actuator 506 and spring 508, involving manipulation of the latch handle 522, can thus be used to select an offset configuration. The latch handle 522 can also be used to overcome a safety stop described below, intended to prevent accidental sliding of the slider 504 completely off the rail 502 in a single action. That is, the handle 522 can be used when it is desired to remove the slider 504 and attached equipment from the rack.

The second way that the actuator 506 interacts with the spring 508 is to implement an automatic safety stop to prevent accidental sliding of the slider 504 and equipment fully off the rail 502, which could be hazardous to personnel and equipment. As noted above, screw 514 extends through a slotted opening 516 in the actuator 506. The slotted opening 516 allows the actuator 506 to move in relation to the spring 508 along an axis of the opening 516, which is aligned with a longitudinal axis of the rail and slider assembly, which, in turn, extends along to a front-to-back axis of the rack. A middle section 530 of the spring 508 (bounded by bend lines 532, 534) is angled in relation to the rail 502 and slider 504 so that bend line 532 is closer to the rail 502 than is 534, and bend line 534 is closer to the slider 504. When the screw 514 is at the end of the slotted opening 516 farthest from the handle 522, the actuator 506 does not extend across the bend line 532, and the puck 512 is biased against a slider 504. However, when the screw 514 is at the end of the slotted opening 516 nearest the tab 522, the end of the actuator 506 opposite the handle 522 extends beyond the bend line 532 causing the middle section 530 of the spring 508 and end section supporting the puck 512 to pivot about the bend line 532 so that the puck 512 is withdrawn from the opening 520.

FIG. 6 shows a sequence of positions depicting the motion by which the safety lock deploys to prevent accidental sliding of the slider 504 and attached equipment fully off of the rail 502. Specifically, the assemblies 540-543 show a series of positions corresponding to progressive movement of the slider 504 in the direction indicated by arrows 544. As shown, the slider 502 includes slider tabs 526 extending inwardly from the flanged ends of the slider 502. The actuator 506 may optionally include actuator tabs 524 extending outwardly therefrom. The actuator tabs 524 interact with the slider tabs 526 so that movement of the slider 502 to a defined position causes movement of the actuator, which, in turn, allows the puck 512 to fall into an opening 520 on the slider 502 to prevent further travel of the slider 502.

In this regard, assembly 540 shows a position where the tabs 524 and 526 are separated and the screw 514 is disposed at the end of the slotted opening 516 closest to the latch handle 522. In this position, the actuator 506 deflects the spring 508 so that the puck 512 is withdrawn from the openings 520 of the slider 504 and the slider 504 is free to slide on the rail 502. Assembly 541 shows a position where the slider 504 has advanced to the point where the slider tabs 526 engage the actuator tabs 524. Further movement of the slider 504, as shown by assembly 542, causes the actuator 506 to move in relation to the spring 508 such that the screw 514 has reached the end of the slotted opening 516 farthest away from the latch handle 522—the limit of travel of the actuator 506 in relation to the spring 508. In this position, the actuator 506 allows deflection of the spring 508 so that the puck 512 is biased against the slider 502, and the puck 512 can then drop into the next opening 520 that comes into alignment with the puck 512.

An operator can thus use the safety stop as follows. To install a piece of equipment on the rack or to slide the equipment to a desired offset or to access the equipment, the operator first pushes the latch handle 522 rearwardly until the screw 514 is at the end of the slotted opening closest to the latch handle 522. As noted above, in this position, the slider is free to slide on the rail 502. In the case of installing a piece of equipment, the slider tabs 526 can easily ride over the actuator tabs 524 as best shown in FIG. 7 where the arrow 550 shows the direction of travel of the slider 504 in relation to the actuator 506 as the equipment is installed in the rack. Specifically, the forward ends of the actuator tabs 524 are bent inwardly to define ramps 560. As the equipment is installed, the rearward ends of the slider tabs 526 contact the surfaces of the ramps causing the actuator 506 to deflect inwardly so that the slider tabs 526 can ride over the actuator tabs. When the equipment is subsequently moved forwardly as shown in FIG. 6 and discussed above, the safety stop is engaged to prevent accidental travel of the slider fully off of the rail. In this regard, the position of the slider tabs 526 is selected to allow the desired access to the equipment without accidental falling from the rack. When it is desired to remove the equipment from the rack, the operator can press the latch handle inwardly and rearwardly so that the actuator tabs 524 pass under the slider tabs 526. In this manner, the safety stop is overridden. It should be noted that an actuator/spring assembly of relatively simply construction allows for selection of an offset configuration, safety stop functionality, and simple installation and removal of equipment in relation to the rack. Further, the actuator/spring assembly is field serviceable in the event of damage.

Figure 11A:
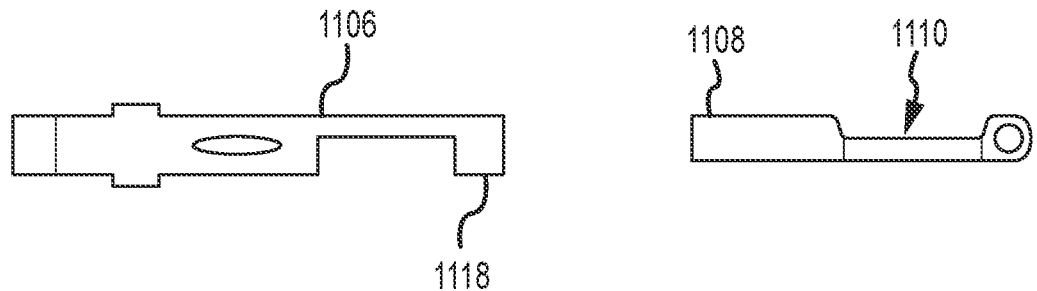
FIGS. 11A-11C illustrate an alternative safety stop mechanism in accordance with the present invention.
Figure 11B:
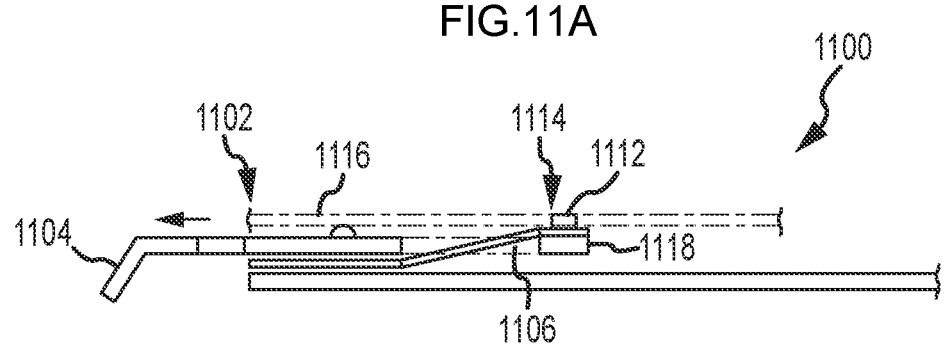
Figure 11C:
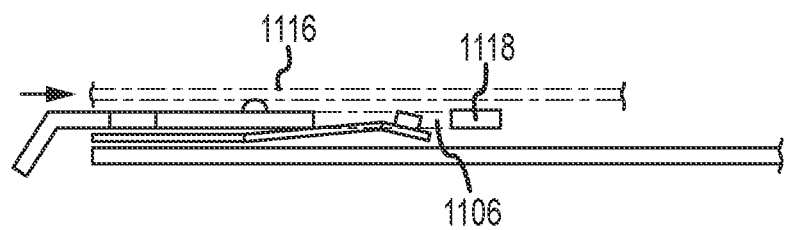

FIG. 11 shows an alternative configuration of an actuator/slider assembly 1100. The actuator 1102 is forced from a latch arm 1102 having a latch handle 1104 and a lock tine arm 1106 (side view shown at top of FIG. 11). The assembly 1100 further includes a spring 1108 that is generally of similar construction as the spring described in the embodiment above, but includes a cutout area 1110 that allows the spring 1108 to extend across the lock tine arm 1106 in the horizontal dimension. The operation of the assembly is the same as described above except that, when the puck 1112 drops into the opening 1114 in the slider 1116, a tine 1118 at the end of the tine arm 1106 prevents the puck 1112 from being forced out of the opening 1114.

Figure 8:
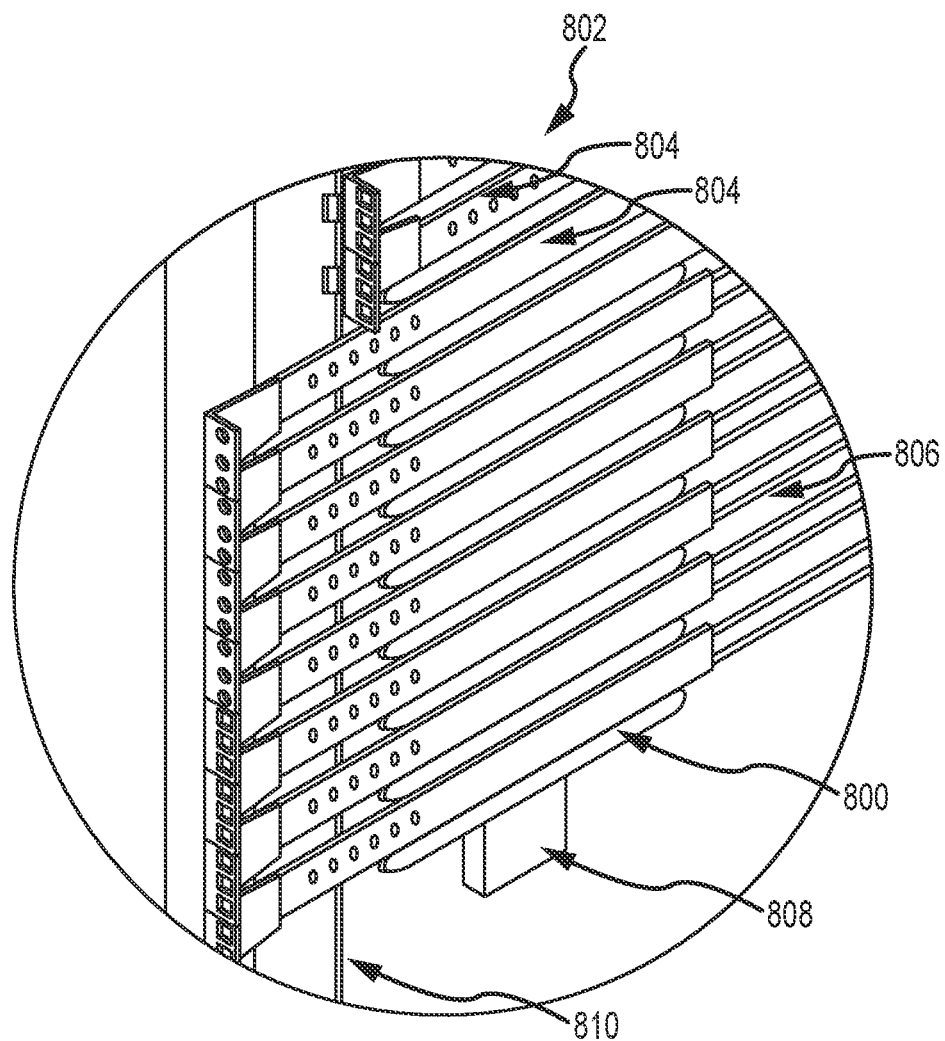
FIGS. 8-10 illustrate an optional external bearing and insertion guide system for use in the system of FIG. 1.
Figure 9:
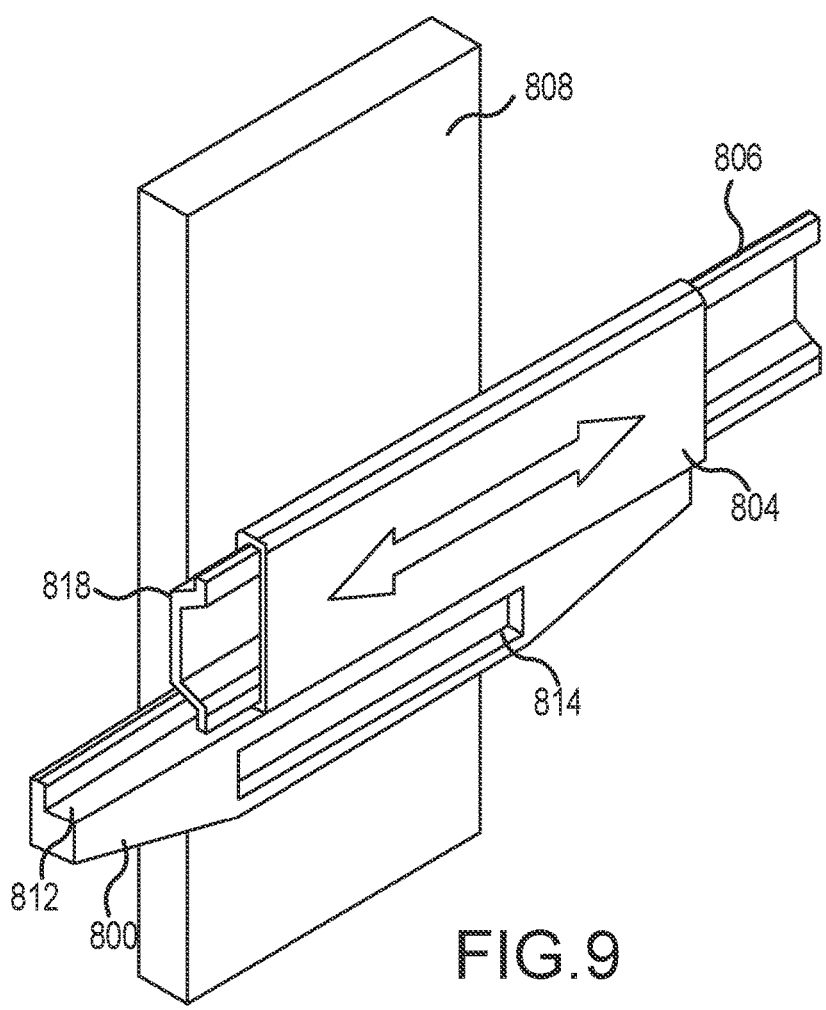
Figure 10:
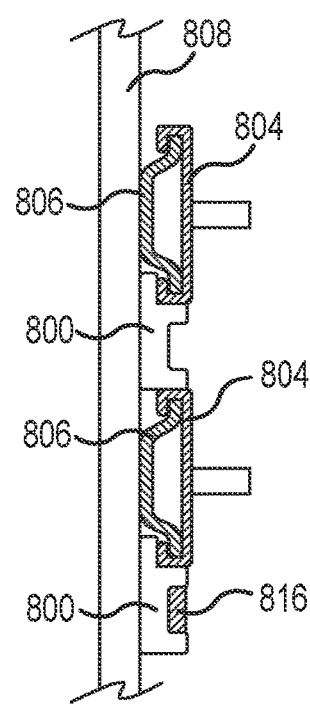

FIGS. 8-10 show optional alignment bearings 800 used in a rack 802. Specifically, FIG. 8 shows a perspective view of a section of the rack 802, FIG. 9 shows a close-up of a portion of the rack section of FIG. 8, and FIG. 10 is a front cross-sectional view of a portion of the rack section of FIG. 8.

The rack 802 includes slider assemblies 804 and horizontal rails 806 mounted on vertical support posts 808 for varying offset configuration in relation to a front face 810 of the rack 802, all as described above. The illustrated rack 802 further includes the noted alignment bearings 800, also mounted on the vertical posts 808 and interposed between adjacent slider assemblies 804. More specifically, the bearings 800 may be dimensioned so that the slider assembly 804 immediately above the bearing 800 lightly contacts or is very closely spaced from the bearing surface 812 when the slider assembly 804 and attached equipment is fully inserted into the rack. Moreover, at least the surface 812 may be formed from a material having frictional characteristics that facilitate easy sliding of the slider assembly 804 on the surface 812 when they are in contact. In the illustrated embodiment, the bearings 800 are formed from injection molded or extruded plastic.

The bottom edges of the bearings 800 are sloped upwardly at the front and back sections of the slider 800 (thus providing a symmetrical geometry so that the same construction can be used for left side and right side bearings 800) to facilitate alignment of the slider assemblies 804 on the rails 806 during insertion as will be described below. Also, the sliders 800 may include recesses 814, as shown in FIGS. 9 and 10, which may optionally house stiffening bars 816 to provide greater bending stiffness in relation to the longitudinal (front-to-back) axis of the bearing 800.

In operation, the bearings 800 serve at least two functions: 1) facilitating alignment of the slider assemblies 804 to the rails 806 for equipment installation, and 2) enhancing the load rating of the rack 802. In the former regard, the bearings 800 extend beyond the front ends 818 of the rails 806 as best seen in FIG. 9. An operator can thus rest the slider assemblies 804 on the bearing surfaces 812 of bearings 800 forward of the rail ends 818 to initiate installation. This is accommodated by the upward slope of the front section of the bearing 800 immediately above the bearing at issue, which provides clearance and guidance of the slider assembly 804. The slider assembly 804 can then be pushed rearwardly until the slider assembly 804 engages the rail 806. The slope of the bearing 800 above the bearing at issue progressively forces the slider assembly 804 with attached equipment into a desired horizontal orientation as the slider assembly 804 is pushed towards the rail ends 818, thus further promoting capture of the rails 806 by the slider assembly 804.

The bearings 800 also enhance the load rating of the rack. For certain environments, e.g., racks deployed on aircraft or launch vehicles and racks supporting heavy equipment, the load bearing capacity of the rack may be critical. In this regard, load peaks may be experienced when the rack is accelerated and when the equipment is slid forwardly from the rack for access to the equipment, thereby increasing the moment on the slider 800. As shown in FIG. 10, the slider assemblies 804, rails 806 and bearings 800 define a substantially continuous (though segmented) vertical column of material substantially at the side-to-side location of the load-bearing interface between the slider assemblies 804 and the rails 806. In this manner, any slight deflection of the slider assembly 804, e.g., due to elastic bending between the slider assembly 804 and rail 806, causes loading to be transferred from the rail 806 to the bearing 800. The bearings 800 thus function as braces to enhance the load bearing capacity of the rails 806 and rack 802.

The bearings 800 increase the load rating of each slider assembly 804. The bearings 800 may be designed to have zero tolerance between them and the slider assemblies 804 (slight interference fit), such that the bearings 800 not only support the slider above them, but also the slider below them. Then, if a slider assembly 804 is inserted at every position (e.g., every 1 U position), regardless if anything is mounted to it or not, the strength of each slider assembly 804 is greatly increased, in both the up and down axis. This is because all slider assemblies 804 are engaged in supporting each other on each side of the assembly and function as one structural unit. This facilitates the design of a rack that is able to withstand much higher loads, which may be desired for some applications (e.g., in mobile applications, where G-shock ratings may be important).

It can be appreciated that the slider can be pre-mounted onto equipment so that assembly of the equipment-mounting adapter is not required at the typically crowded rack location. Accordingly, installation at the rack is very simple, and there is no need to disturb adjacent equipment in neighboring racks of a data center. However, it is desirable in this regard to accurately mount the equipment so that the side-to-side spacing of the sliders matches the said spacing and the vertical position of the equipment does not result in interference of the equipment or mounting flanges with adjacent equipment or mounting flanges.

If an operator was only concerned about mounting the equipment, the mounting process could be addressed by simply providing a set of rails mounted on a table top. The rails could be mounted on the table top so that the horizontal spacing between the rails matched that in the racks (if different rack widths were used in the data center, multiple rail sets could be provided on the table top), and the vertical height of the rails above the table top was a fraction of 1 u (e.g., 0.5 u). The piece of equipment to be mounted could then be placed between the rails on the table top. Sliders could then be slid onto the rails. Finally, the mounting flanges on the sliders could be bolted to the front face of the equipment and/or the mounting adapters could be assembled between the equipment sides and the sliders. The equipment and sliders, as a unit, could then be removed from the table-mounted rails and inserted into the desired rack location as described above.

However, certain equipment has a height that is a multiple of 1 u. For such equipment, it will be appreciated that the same process as described above could be utilized but with multiple rail sets mounted on the table top, with the vertical spacing between rail sets selected to match that of the rack (e.g., 1 u spacing between vertically adjacent rail sets). The multiple u equipment would then be placed on the table between the stack of rails and mounted to the appropriate number of rail sets as described above. However, though this is easier than mounting the multiple u equipment to the sliders at the crowded rack (working at whatever height required), it is still somewhat difficult to assemble the side mounting adapters to each set of rails in the table-mounted stack.

Figure 12A:
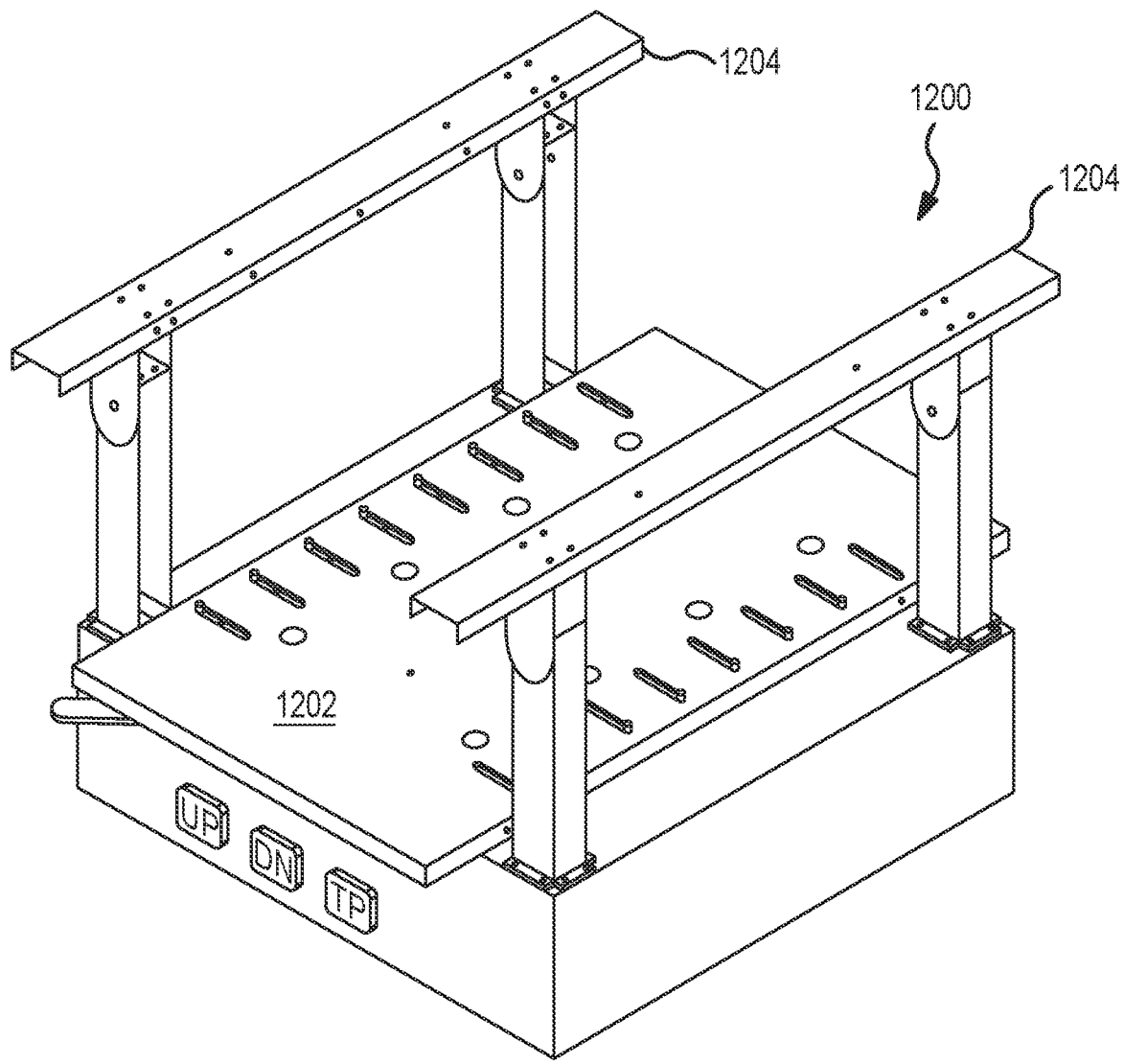
FIGS. 12A-12B are perspective views showing an assembly fixture in accordance with the present invention.
Figure 12B:
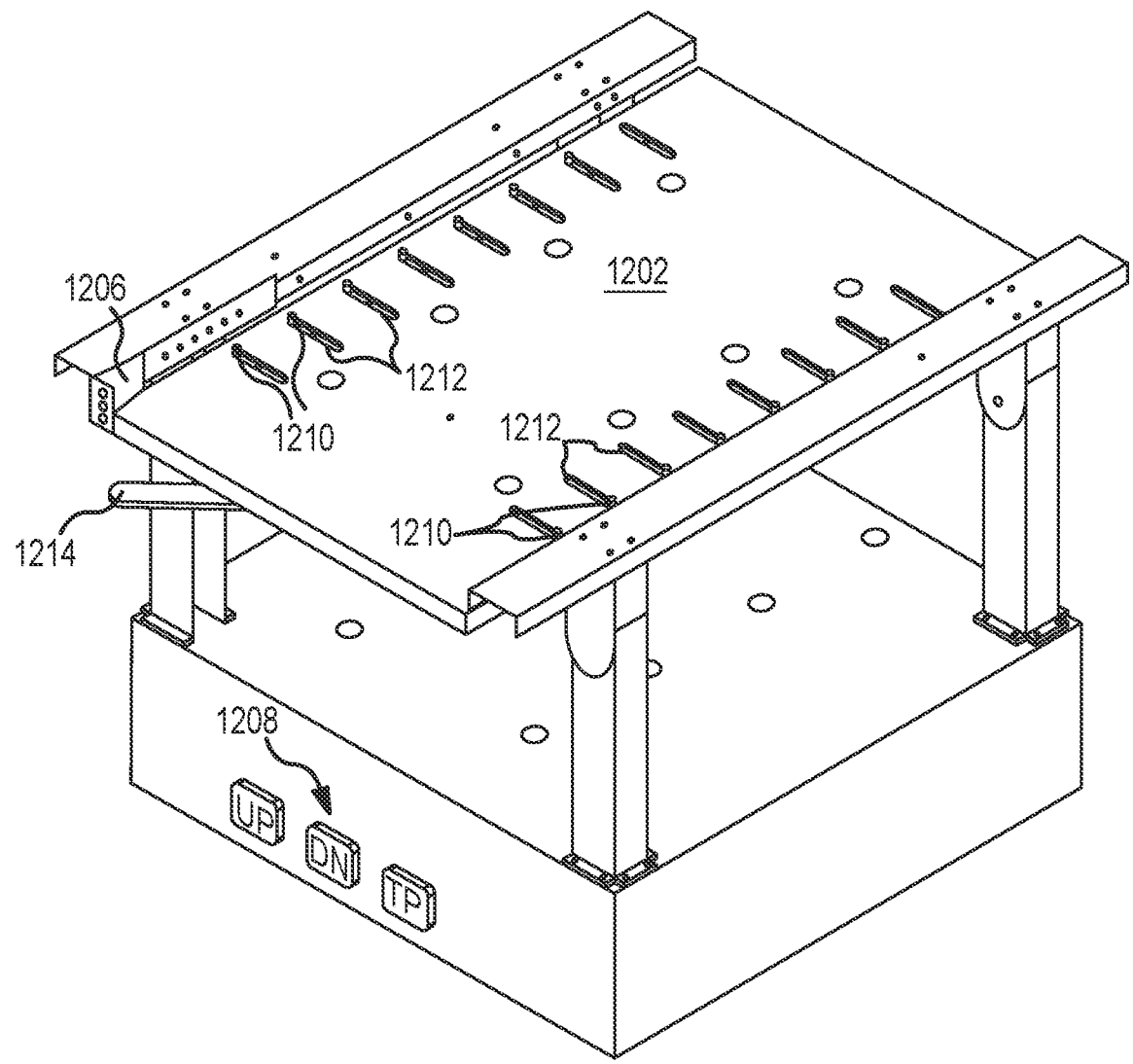

FIGS. 12A-12B show an assembly fixture 1200 that can be used for mounting 1 u height or multi u height equipment to sliders. The fixture 1200 includes a deck 1202 for supporting a piece of equipment to be mounted and rail mounts 1204 for receiving slider assemblies 1206 to be mounted. The deck 1202 is supported by an elevator that can be operated by controls 1208 to move the deck up or down (in relation to the rail mounts 1204) in 1 u increments, or to move the deck to its top position. FIG. 12B shows the deck 1202 in its top position, and FIG. 12A shows the deck in a lowered position. The illustrated assembly 1200 also includes catering pins 1210 that can be moved in slots 1212 by operation of handle 1214. Moving handle 1214 moves the left and right side pins 1210 symmetrically so that the pins are equidistant from the rail mounts 1204.

To mount a piece of equipment, the equipment is placed on the deck 1202 between the pins 1210 and the deck 1202 is moved to its top position. The lever 1214 is then operated so that the pins 1210 engage the opposite sides of the equipment and center the equipment. Slider assemblies 1206 are then inserted on the rail mounts 1204 and attached to the equipment front face. Appropriate brackets or standoffs are then used to mount the slider assemblies 1206 to the equipment sides. If the equipment is a 1 u piece of equipment, the slider assemblies 1206 with attached equipment can then be removed from the fixture 1200 and inserted with the rack. It will be appreciated that the spacing of the rail mounts 1204 matches that of the rack rails. If different rack widths are employed in a data center, multiple fixtures 1200 may be utilized or the assembly 1200 can be constructed to allow repositioning of the rail mounts 1204.

In the case of a multiple u piece of equipment, the controls 1208 can be used to lower the deck 1202 by an amount equal to the vertical spacing of rack rails. In this regard, the top position of the deck 1202 is selected to match the desired vertical spacing of the rail center to the equipment bottom, e.g., 0.5 u. Each time the "down button is pressed, the deck may be lowered in one increment of the rail spacing, e.g., 1.0 u. This process can be repeated until the desired number of slider assembly pairs are mounted on the equipment. The equipment can then be removed from the fixture 1200 and inserted at the desired rack location.

Figure 13A:
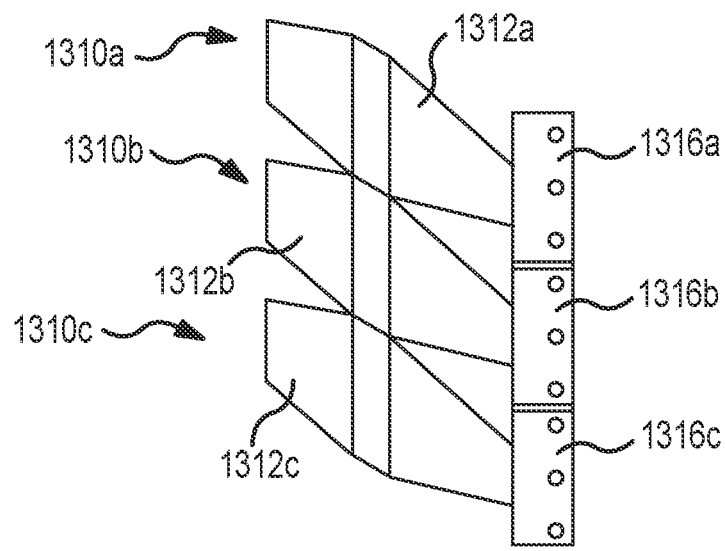
FIGS. 13A and 13B show perspective and side views of a set of rail assemblies that include rail portions which include mechanical ramps.
Figure 13B:
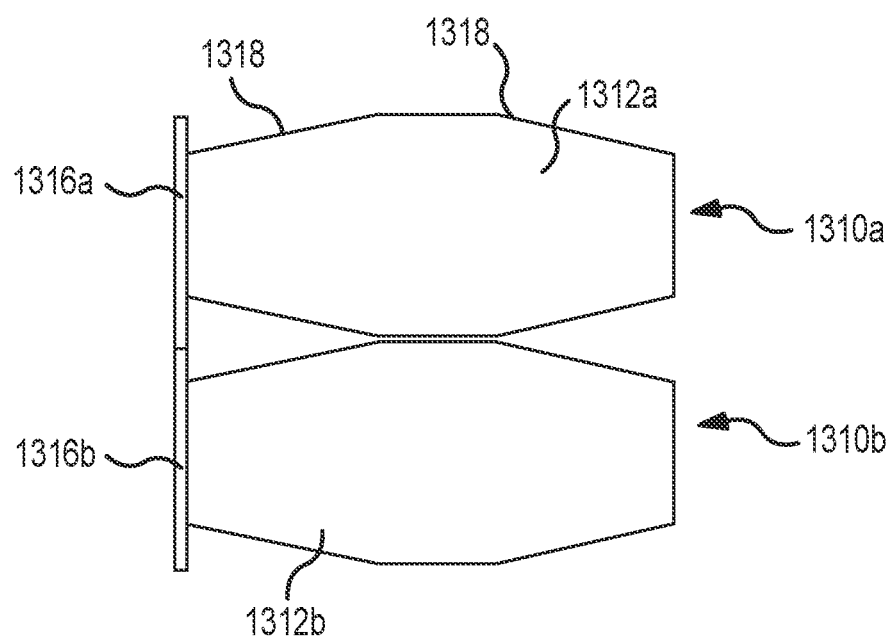

FIGS. 13A and 13B show perspective and side views of a set of rail assemblies 1310*a-c* that include rail portions 1312*a-c* and vertically segmented mounting flanges 1316*a-c*, respectively. As shown, the rail portions 1312*a-c* are shaped such that the vertically segmented mounting flanges 1316*a-c* do not contact each other when the rail portions 1312*a-c* are under a loaded condition (e.g., when the rail assemblies 1310*a-c* are coupled to equipment). The rail portions 1312*a-c* include mechanical interference ramps 1318 that are bidirectionally slanted. When slider assemblies pass adjacent vertically segmented mounting flanges 1316*a-c* from either direction, the dimensions of the ramps 1318 are formed so that the ramped section of the rail portions 1312*a-c* will control the separation of the flanges 1316*a-c* as they pass each other and prevent them from contacting each other. If the rail portions 1312*a-c* are set at or near the same horizontal offset and the mechanical load upon an upper slider begins to deform the upper slider, the ramps 1318 may contact each other and the upper slider will be supported, thereby limiting the amount of deflection it will experience, thereby preventing possible damage to that assembly. It should be appreciated that this feature may also work in other orientations where the load or acceleration direction is not vertical.

Figure 14A:
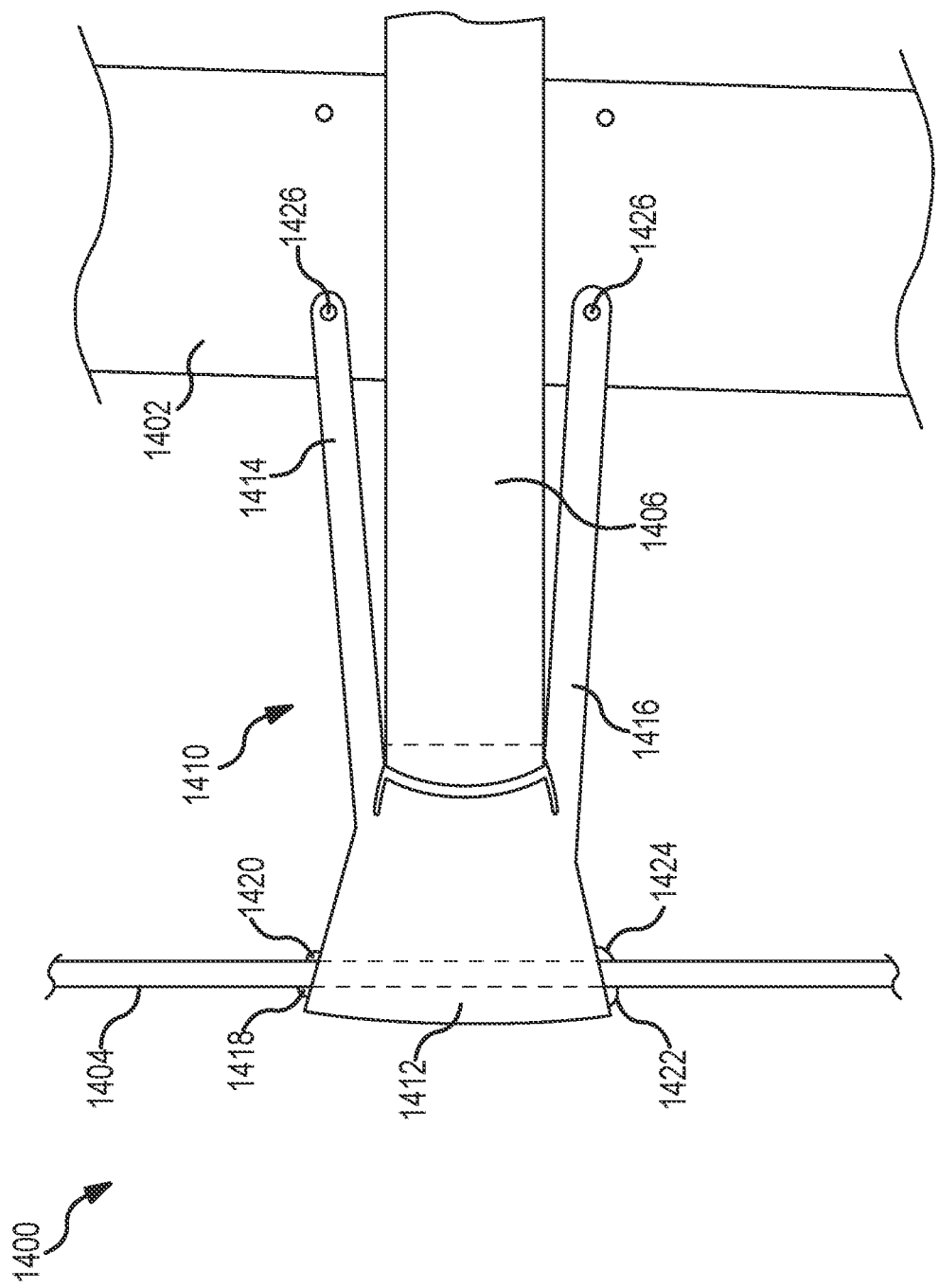
FIGS. 14A and 14B show side and perspective views of a removable insertion guide that may be operative to assist a user to insert equipment into a rack.
Figure 14B:
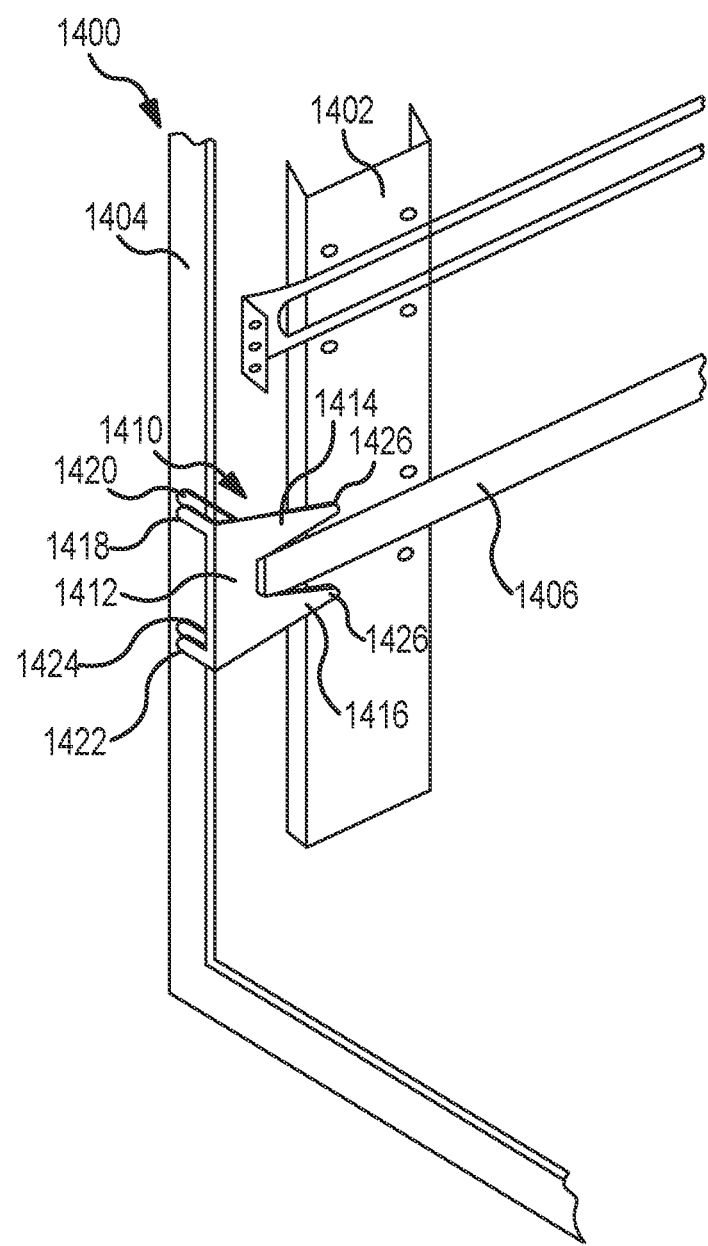

FIGS. 14A and 14B show side and perspective views of a removable insertion guide 1410 that may be operative to assist a user to insert equipment into a rack 1400. Similar to racks described above, the rack 1400 may include a vertical side support post 1402 and a front surface 1404. Further, the rack may include one or more rails 1406. The insertion guide 1410 may include two arms 1414 and 1416 that include pins 1426 which may be inserted into openings (e.g., holes) in the vertical side support post 1402. Further, the insertion guide 1410 may include a "funnel" portion 1412 that is shaped to receive and guide a slider that may be attached to a piece of equipment. To further secure the insertion guide 1410 to the rack 1400, the insertion guide 1410 may include a plurality of fingers 1418, 1420, 1422, and 1424 that are shaped and sized to secure the insertion guide 1410 to the front surface 1404 of the rack 1400. The funnel portion 1412 of the insertion guide 1410 may be designed to support and guide a slider assembly during installation of equipment into the rack 1400. The removable insertion guide 1410 may be symmetrical and may function on either side of the rack, front or back. The insertion guide 1410 may therefore be used individually or in one or more pairs (for multi U equipment with multiple sliders attached) to guide the insertion of equipment (or accessories, trays, or the like) into the rack. The guide 1410 may also be attached and removed or moved to a different location on the same or a different rack.

The foregoing description of the present invention has been presented for purposes of illustration and description. Furthermore, the description is not intended to limit the invention to the form disclosed herein. Consequently, variations, various combinations, and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed:

1. A mounting system for supporting electronic equipment such as in a data center, comprising:
    a support structure dimensioned for supporting multiple pieces of electronic equipment in a vertically stacked configuration, said support structure having a front end defining one or more openings where front surfaces of said electronic equipment are disposed adjacent said one or more openings;
    first structure for securing a first piece of equipment in a first fixed position in relation to said support structure so that a first front surface of said first piece of equipment has a first horizontal offset in relation to said front end of said support structure, wherein said first structure allows for fixing said first piece of equipment at any of multiple offset positions in relation to said front end of said support structure and said first structure further includes a latch for latching said mounting structure in relation to said support structure so as to secure the equipment at said first fixed position; and
    second structure for securing a second piece of equipment in a second fixed position in relation to said support structure so that a second front surface of said second piece of equipment has a second horizontal offset, different than said first horizontal offset, in relation to said front end of said support structure, wherein said second structure allows for fixing said second piece of equipment at any of multiple offset positions in relation to said front end of said support structure and said second structure further includes a second latch for latching said mounting structure in relation to said support structure so as to secure the equipment at said second fixed position.

2. The system as set forth in claim 1, wherein said first structure comprises mounting structure for attachment to said first piece of equipment and a rail assembly, connected to said support structure, for slidably engaging said mounting structure.

3. The system as set forth in claim 2, wherein said mounting structure can be slidably disengaged from said rail assembly.

4. The system as set forth in claim 2, wherein said mounting system includes multiple rail assemblies and said mounting structure is interchangeably engageable with each of said multiple rail assemblies.

* * * * *